(12) United States Patent
Simon et al.

(10) Patent No.: US 12,477,687 B1
(45) Date of Patent: Nov. 18, 2025

(54) GROUND-SOURCE THERMAL SYSTEM FOR REJECTING DATA CENTER WASTE HEAT TO A FACILITY

(71) Applicant: Schlumberger Technology Corporation, Sugar Land, TX (US)

(72) Inventors: Matthieu Simon, Clamart (FR); Cindy Demichel, Clamart (FR); Olivier Lecoq, Clamart (FR); Carlos Merino, Clamart (FR); Sylvain Thierry, Clamart (FR); Rafael Vinit, Clamart (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 18/884,615

(22) Filed: Sep. 13, 2024

Related U.S. Application Data

(60) Provisional application No. 63/648,552, filed on May 16, 2024.

(51) Int. Cl.
*H05K 7/20* (2006.01)
*F24T 10/00* (2018.01)
(Continued)

(52) U.S. Cl.
CPC .......... *H05K 7/20272* (2013.01); *F24T 10/00* (2018.05); *H05K 7/20327* (2013.01);
(Continued)

(58) Field of Classification Search
None
See application file for complete search history.

(56) References Cited

U.S. PATENT DOCUMENTS 9,915,247 B2    3/2018    Stewart
10,394,290 B2 *   8/2019    Hardin ............... H05K 7/20836
(Continued)

FOREIGN PATENT DOCUMENTS

CN    112627797 A    4/2021
CN    113294137 A    8/2021
(Continued)

OTHER PUBLICATIONS

Earth Energy Designer (EED) Version 4 Update Manual, Version 4.3, downloaded on Jan. 6, 2025 from the internet [https://buildingphysics.com/EED4.pdg], 72 pages.
(Continued)

*Primary Examiner* — Courtney L Smith
(74) *Attorney, Agent, or Firm* — Jeffrey D. Frantz

(57) ABSTRACT

A thermal system includes a borehole heat exchanger, a facility, a data center including at least one heat generating electronic component, and a ground-source heat pump. A dynamic downhole fluid circuit connects the data center, the borehole heat exchanger, and the ground-source heat pump with a flow of a downhole fluid and is configured to connect the data center, the borehole heat exchanger, and the ground-source heat pump in a plurality of different configurations to reject heat from the data center. The thermal system further includes a facility fluid circuit for connecting the facility and the ground-source heat pump with a facility fluid, wherein the ground-source heat pump thermally connects the dynamic downhole fluid circuit and the facility fluid circuit.

20 Claims, 19 Drawing Sheets

(51) Int. Cl.
  *E21B 36/00* (2006.01)
  *F03G 4/00* (2006.01)
(52) U.S. Cl.
  CPC ............ H05K 7/2079 (2013.01); *E21B 36/00* (2013.01); *F03G 4/00* (2021.08)

(56) References Cited

U.S. PATENT DOCUMENTS

| | | | | |
|---|---|---|---|---|
| 11,574,372 | B2* | 2/2023 | Barbour | H04L 67/1097 |
| 12,048,115 | B2* | 7/2024 | Cairone, Jr. | H05K 7/20254 |
| 12,048,128 | B2* | 7/2024 | Keisling | H05K 7/20781 |
| 12,232,295 | B2* | 2/2025 | Weisemann | H05K 7/20745 |
| 2010/0288465 | A1 | 11/2010 | Stewart | |
| 2011/0132600 | A1 | 6/2011 | Kaminsky | |
| 2012/0090807 | A1 | 4/2012 | Stewart | |
| 2014/0368991 | A1* | 12/2014 | James | H05K 7/20781 |
| | | | | 361/679.52 |
| 2015/0218928 | A1 | 8/2015 | Suvanen | |
| 2020/0045857 | A1 | 2/2020 | Magcale | |
| 2020/0190937 | A1 | 6/2020 | Nevison | |
| 2020/0191444 | A1 | 6/2020 | Nevison | |
| 2021/0406833 | A1 | 12/2021 | Chen | |
| 2022/0400577 | A1* | 12/2022 | Smith | H05K 7/20236 |
| 2023/0124192 | A1 | 4/2023 | Liedtke | |
| 2023/0358120 | A1 | 11/2023 | Lau | |
| 2024/0318537 | A1 | 9/2024 | Loviken | |
| 2024/0334644 | A1* | 10/2024 | Cairone, Jr. | H05K 7/20254 |
| 2025/0066927 | A1* | 2/2025 | Conner | C25B 1/04 |
| 2025/0071953 | A1* | 2/2025 | Chehade | G06F 11/32 |

FOREIGN PATENT DOCUMENTS

| | | |
|---|---|---|
| CN | 115493176 A | 12/2022 |
| CN | 116518585 A | 8/2023 |
| CN | 116576494 A | 8/2023 |
| EP | 2811109 A1 | 12/2014 |
| EP | 4489539 A1 | 1/2025 |
| WO | 2016108913 A1 | 7/2016 |
| WO | 2023034878 A1 | 3/2023 |
| WO | 2023185961 A1 | 10/2023 |

OTHER PUBLICATIONS

Beck, M. et al., Geometric arrangement and operation mode adjustment in low-enthalpy geothermal borehole fields for heating, Energy, vol. 49, 2013, pp. 434-443.

Edelman, L., "Facebooks hyperscale date center warms Odense", downloaded from the Internet on Jan. 6, 2025 from [https://tech.facebook.com/engineering/2020/7/odense-data-center-2/], 2020, 6 pages.

Eskilsen, P., "Thermal Analysis of Heat Extraction Boreholes", Doctoral thesis. Department of Mathematical Physics, University of Lund, Lund, Sweden, 1987, 222 pages.

"Geothermal Energy", Chapter 29 in ASHRAE Handbook—Heating, Ventilating, and Air-Conditioning Applications. Atlanta, Georgia, ASHRAE. 1995, 29 pages.

Grundmann, R. M., "Improved Design Methods for Ground Heat Exchangers", MSc thesis, Oklahoma State University, Stillwater, 2016, 174 pages.

Hooke, R. et al., ""Direct Search" Solution of Numerical and Statistical Problems", Journal of the ACM, 1961 8(2), pp. 212-229.

Macgregor, K., "Full Steam Ahead: Unearthing the Power of Geotherman", downloaded on Jul. 29, 2024 from [https://www.nrel.gov/news/features/2023/full-steam-ahead-unearthing-the-power-of-geothermal.html] 2023, 11 pages.

Ng, A. et al., "Policy invariance under reward transformations: Theory and application to reward shaping," Proceedings of the Sixteenth International Conference on Machine Learning, 1999, 99, 10 pages.

Product Brochure "Chaudiere Numerique" Neural-IT downloaded on Jul. 29, 2024 from [https://neutral-it.com/chaudiere-numerique/], undated, 12 pages.

Reitsman, Stan, CEO, Geosource Energy Inc., "Commercial Urban Drilling: Challenges and Successes," [Online]. Available: https://igshpa.org/wp-content/uploads/13-Commercial-Urban-Drilling-Stan-Reitsma.pdf. [Accessed Jul. 29, 2024].

Meibodi,, S. S. et al., "The future role of energy geostructures in fifth generation district heading and cooling networks", Energy, 2021, 240, pp.

* cited by examiner

GROUND-SOURCE THERMAL SYSTEM FOR REJECTING DATA CENTER WASTE HEAT TO A FACILITY

CROSS-REFERENCE TO RELATED APPLICATIONS

This application claims priority to and the benefit of U.S. Provisional Application No. 63/648,552, filed on May 16, 2024, which is hereby incorporated by reference in its entirety.

BACKGROUND OF THE DISCLOSURE

Ground-source or geothermal heat pump systems offer energy-efficient heating and cooling solutions by leveraging the relatively stable temperature of the Earth's subsurface. For example, heating and cooling can be achieved by exchanging thermal energy with the ground through a ground heat exchanger implemented as a borefield of one or more wellbores. A wide variety of facilities can benefit from the efficient heating and cooling provided by such systems, such as buildings, facilities, and other consumers having thermal requirements.

Data centers providing computing services generally produce a large amount of heat and accordingly require significant cooling for rejecting waste heat. This is typically achieved through various means, such as dry or wet coolers or air-source heat pumps, which ultimately reject heat to an ambient environment. This has many negative impacts such as significant energy expenditure and heating of the ambient environment, among others. Accordingly, data centers can benefit from the efficient cooling that ground-source heat pump systems can offer. Even further, however, by including a data center in a ground-source thermal system as both a thermal consumer and a thermal producer, or a "prosumer," can reduce or eliminate the negative impacts typically associated with data center cooling. For instance, by sizing and configuring a data center relative to the heat loads of buildings and other thermal consumers, data center waste heat can be advantageously leveraged to provide heating in the thermal system, reducing the amount of heat extracted from the ground and the overall amount of energy required to provide heating and cooling. Thus, such systems exhibit improved energy efficiency for providing ground-source heat, as well as a reduced size or drilled length of a corresponding borefield.

SUMMARY

In some embodiments, a thermal system includes a borehole heat exchanger, a facility, a data center including at least one heat generating electronic component, and a ground-source heat pump. The data center, the borehole heat exchanger, and the ground-source heat pump are connected by a dynamic downhole fluid circuit with a flow of a downhole fluid. The downhole fluid circuit is configured to connect the data center, the borehole heat exchanger, and the ground-source heat pump into a plurality of different configurations to reject heat from the data center. The thermal system further includes a facility fluid circuit for connecting the facility and the ground-source heat pump with a facility fluid. The ground-source heat pump thermally connects the dynamic downhole fluid circuit and the facility fluid circuit.

In some embodiments, a dynamic downhole fluid circuit includes a data center, a borehole heat exchanger, and a ground-source heat pump for transferring heat with a facility. The dynamic downhole fluid circuit is configurable between a first mode for rejecting heat from the data center to the BHE, a second mode for rejecting heat from the data center to the BHE and to the GSHP, and a third mode for rejecting heat from the data center and from the BHE to the GSHP.

In some embodiments, a method of operating a thermal system includes generating a data center heat with at least one heat generating electronic component of a data center, and transferring the data center heat from the data center to a downhole fluid. The method includes exchanging heat between a facility and the downhole fluid via a ground-source heat pump (GSHP) to fulfill at least a portion of a thermal load of the facility. The method further includes maintaining a thermal balance of the downhole fluid with a borehole heat exchanger (BHE) implemented in a borefield.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 illustrates an example of a downhole fluid circuit, according to at least one embodiment of the present disclosure;

FIG. 2-2 illustrates an example of a downhole fluid circuit, according to at least one embodiment of the present disclosure;

FIG. 3-1 illustrates an example configuration or operating mode of a downhole fluid circuit, according to at least one embodiment of the present disclosure;

FIG. 3-2 illustrates example fluid paths for the configuration of the downhole fluid circuit of FIG. 3-1;

FIG. 3-3 illustrates a downhole fluid circuit for implementing the example configuration of FIG. 3-1, according to at least one embodiment of the present disclosure;

FIG. 4-1 illustrates an example configuration or operating mode of a downhole fluid circuit, according to at least one embodiment of the present disclosure;

FIG. 4-2 illustrates example fluid paths for the configuration of the downhole fluid circuit of FIG. 4-1;

FIG. 4-3 illustrates a downhole fluid circuit for implementing the example configuration of FIG. 4-1, according to at least one embodiment of the present disclosure;

FIG. 5-1 illustrates an example configuration or operating mode of a downhole fluid circuit, according to at least one embodiment of the present disclosure;

FIG. 5-2 illustrates example fluid paths for the configuration of the downhole fluid circuit of FIG. 5-1;

FIG. 5-3 illustrates example fluid paths for the configuration of the downhole fluid circuit of FIG. 5-1;

FIG. 5-4 illustrates a downhole fluid circuit 510-4 for implementing the example configuration of FIG. 5-1, according to at least one embodiment of the present disclosure;

FIG. 6-1 illustrates an example configuration or operating mode of a downhole fluid circuit, according to at least one embodiment of the present disclosure;

FIG. 6-2 illustrates example fluid paths for the configuration of the downhole fluid circuit of FIG. 6-1;

FIG. 6-3 illustrates a downhole fluid circuit 610-3 for implementing the example configuration of FIG. 6-1, according to at least one embodiment of the present disclosure;

FIG. 6-4 illustrates a downhole fluid circuit 610-4 for implementing the example configuration of FIG. 6-1, according to at least one embodiment of the present disclosure;

FIG. 7-1 illustrates an example thermal load for an example facility, according to at least one embodiment of the present disclosure;

FIG. 7-2 illustrates an example temperature profile for a borefield;

FIG. 7-3 illustrates an example thermal load for an example facility as implemented in a thermal system with a data center as described herein, according to at least one embodiment of the present disclosure;

FIG. 7-4 illustrates an example temperature profile for a borefield;

DETAILED DESCRIPTION

Figure 1:
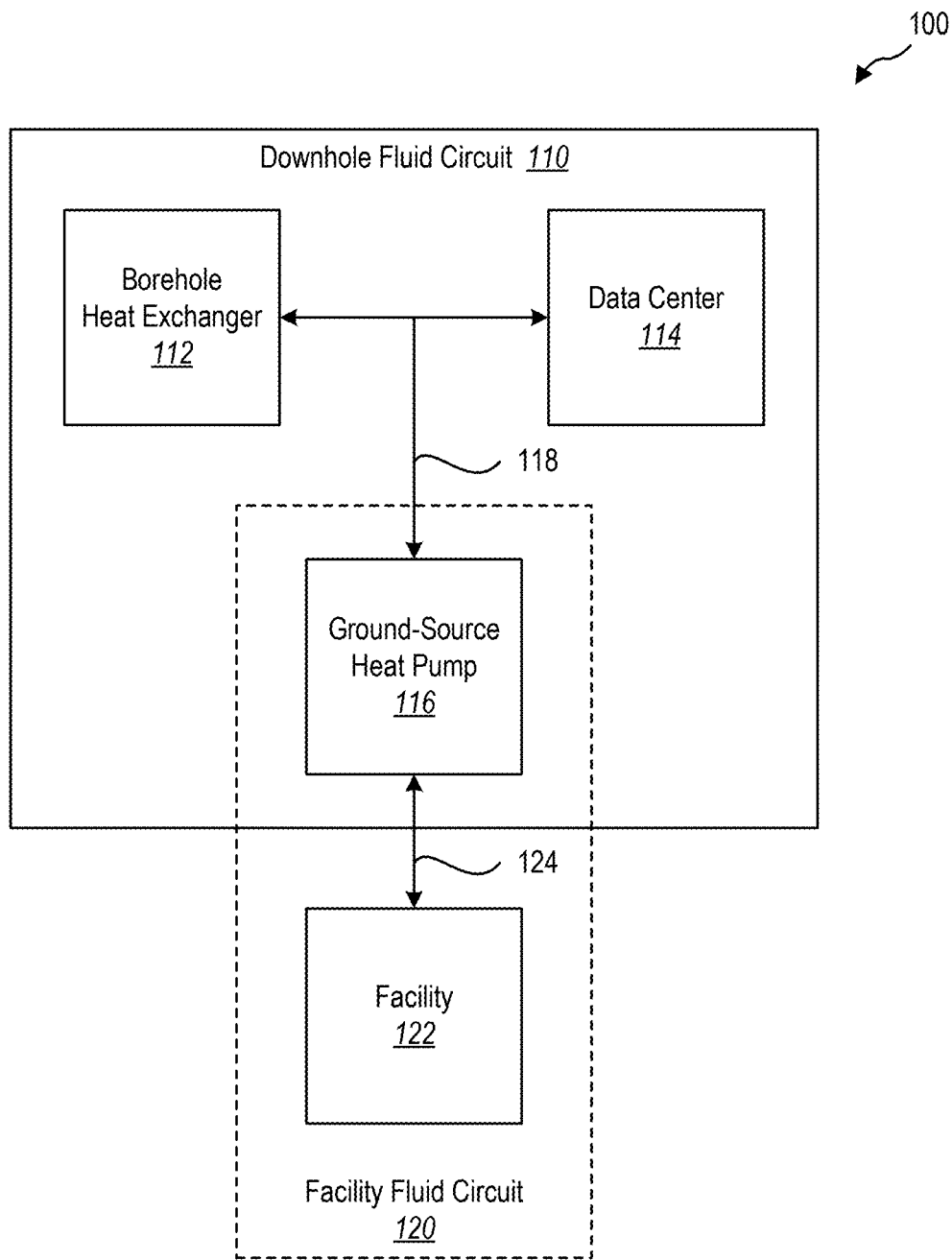
FIG. 1 is an example of a thermal system for transferring heat between one or more components, according to at least one embodiment of the present disclosure.

This disclosure generally relates to thermal systems for providing heating and cooling via a ground-source heat pump. Ground-source heat pumps are typically used to extract thermal energy from the ground for providing heating, as well as injecting thermal energy into the ground for providing cooling, for instance for a commercial, residential or industrial building. For instance, ground-source heat pumps may be implemented for providing cooling to data centers, as well as for providing heating and cooling to buildings and other facilities.

The thermal systems described herein implement data centers for advantageously utilizing data center waste heat to heat associated facilities. For instance, a data center, a facility, and a borehole heat exchanger may be connected via a downhole fluid circuit. Each of these components may exchange heat with a downhole fluid of the downhole fluid circuit to meet their individual thermal needs. Thus, heat rejected from the data center for cooling the data center may be advantageously transferred to the facility to provide efficient and sustainable heating of the facility, for example, rather than implementing additional devices for heating and cooling these components.

The present thermal systems may be implemented based on an intention sizing and dimensioning of the components of the downhole fluid circuit. To elaborate, a power capacity of the data center along with the total drilled length of the borehole heat exchanger together may be specifically sized and dimensioned with respect to the thermal load of the facility. For instance, the data center power capacity may be dimensioned to contribute to the heat load of the facility, but may not be so big as to necessitate a large borehole heat exchanger in order to sufficiently cool the data center during times when the data center waste heat may not be (wholly or in part) rejected to the facility. For instance, the power capacity may be dimensioned based on a minimum drilled length of the borehole heat exchanger to reduce the expense and facilitate the ease of implementation of the thermal system. In many cases the data center power capacity may be smaller than a thermal load of the facility, and the data center may be operated at a full power capacity at all times while rejecting all of its waste heat via the downhole fluid circuit. In this way, the data center is not merely an opportunistic source of heat energy, but an integral part of the thermal system that is intentionally sized and configured for the specific thermal loads of the facility.

The thermal systems described herein may be implemented based on the downhole fluid circuit being dynamically configured to operate in a variety of different operating modes or configurations. For instance, a system of valves, pumps, sensors, and pipes may be dynamically switched in order to flow the downhole fluid in different fluid paths and to different components of the downhole fluid circuit, and in this way facilitate the transfer of heat to and/or from the various components. In some embodiments, the thermal system may operate in a first operating mode, where the data center and the borehole heat exchanger both transfer heat to the facility. In some embodiments, the thermal system may operate in a second operating mode, where the data center transfers heat to both the facility and to the borehole heat exchanger. In some embodiments, the thermal system may operate in a third operating mode, where the data center transfer heat only to the borehole heat exchanger and not to the facility. In some embodiments, the thermal system may operate in a fourth operating mode, where the data center and the facility transfer heat to the borehole heat exchanger.

Additional details will now be provided regarding systems described herein in relation to illustrative figures portraying example implementations. FIG. 1 shows an example of a thermal system 100 for transferring heat or otherwise exchanging calories between one or more components, according to at least one embodiment of the present disclosure. For instance, the thermal system 100 includes a downhole fluid circuit 110 for transferring heat between a borehole heat exchanger (BHE) 112, a data center 114, and a ground-source heat pump (GSHP) 116. The BHE 112, the data center 114, and the GSHP 116 may be connected in the downhole fluid circuit 110 via a flow of a downhole fluid 118 (e.g., based on being in thermal communication with the downhole fluid 118). As described herein, the downhole fluid circuit 110 may be dynamic, and may be configured, or operated in various configurations or operating modes, to advantageously transfer heat between the various components of the downhole fluid circuit 110, to provide heating and/or cooling to one or more components.

As just mentioned, the GSHP 116 is included in the downhole fluid circuit 110, and is additionally included in a facility fluid circuit 120. For example, the GSHP 116 may be connected to a facility 122 via a flow of a facility fluid 124 (e.g., based on being in thermal communication with the facility fluid 124). In this way, the GSHP 116 may connect (e.g., thermally) the downhole fluid circuit 110 and the facility fluid circuit 120. For example, the GSHP 116 may be a heat pump device for transferring heat between the downhole fluid 118 and the facility fluid 124. The GSHP 116 may operate a reversible refrigeration cycle for transferring heat between the downhole fluid circuit and the facility fluid circuit via a working fluid circuit. For instance, the GSHP 116 may include a downhole heat exchanger on a downhole fluid side of the GSHP 116, and a facility heat exchanger on a facility fluid side of the GSHP 116 for transferring heat to a coolant or working fluid of the GSHP 116. The GSHP 116 may apply mechanical work to the coolant fluid to expand and compress the coolant fluid and in this way transfer heat between the downhole fluid 118 and the facility fluid 124. The GSHP 116 may operate in either direction, for example, to transfer heat from downhole fluid 118 to the facility fluid 124, or from the facility fluid 124 to the downhole fluid 118. In this way, the GSHP 116 may exchange heat with the facility 122 via the facility fluid 124 to provide heating and/or cooling to the facility 122.

The facility 122 may be any entity or consumer having thermal (e.g., heating and/or cooling) needs. For example, the facility 122 may be (one or several) commercial or residential buildings, structures, locations, spaces, or sites. In another example, the facility 122 may be a campus, neighborhood, or other collection of thermal consumers. The facility 122 may include any building, object, infrastructure, or the like having thermal needs, such as for heating and/or cooling a road, a bridge, a roof, a ground, a liquid or fluid, a building, space, or any other object which may be heated or cooled based on the techniques described herein.

In some embodiments, the facility 122 may receive 100%, or all, of its heating and cooling needs from the downhole fluid circuit 110. For example, the facility 122 may not implement any auxiliary or supplemental heating or cooling device to provide heating and cooling to the facility 122 apart from that provided by the downhole fluid circuit 110. In this way, all of the thermal needs of the facility 122 may be achieved through the highly efficient downhole fluid circuit 110.

In some embodiments, the facility 122 may include one or more supplemental heating and/or cooling device for supplementing the heating and/or cooling provided by the downhole fluid circuit 110. For example, the facility 122 may include chillers, dry coolers, boilers, or other thermal devices for providing conditioning of the facility 122. In some embodiments, the facility 122 includes an air-source heat pump, for example as part of the facility fluid circuit 120. In some cases, however, the downhole fluid circuit 110 may provide a threshold level of heating and/or cooling to the facility 122. For instance, a heating threshold of 70%, 80%, 90%, or more (or any value therebetween) of the heating and/or cooling of the facility 122 may be provided by the downhole fluid circuit 110. For example, the downhole fluid circuit 110 may provide heating and/or cooling to the facility 122, which may fulfill much of the needs of the facility 122, and the supplemental means may be implemented to meet a peak heating load of the facility 122, for example, from time to time. In this way, the downhole fluid circuit 110 may provide a significant portion of the heating and cooling of the facility 122, and may maintain a high level of efficiency.

As mentioned, the downhole fluid circuit 110 includes a BHE 112. The BHE 112 may include a borefield having one or more boreholes or wellbores formed within a volume of ground defining the borefield. The borefield may include a central wellhead from which a plurality of slanted or inclined boreholes are distributed in the neighboring ground volume. One or more pipes, hoses, tubes, or other fluid passages may be positioned within the one or more wellbores to form ground loops within the borefield. For instance, the wellbores may be at least partially filled with a grout to maintain the ground loops in place and to facilitate heat transfer between the ground loops and the ground. The ground loops have a fluid inlet and a fluid outlet but may have any configuration in the wellbore, for instance coaxial or U-shaped. In this way, the downhole fluid 118 may flow through the BHE 112, and heat may be exchanged between the ground and the downhole fluid 118. In this way, the BHE 112 may be leveraged for providing heating and/or cooling based on an exchange of heat or calories with the ground through the downhole fluid 118.

In some embodiments, the BHE 112 may include or may be incorporated as an open loop component or system. For example, the BHE 112 may include and/or may access an aquifer. Ground water may be pumped from the aquifer for exchanging heat with the downhole fluid circuit, and/or the ground water may be the downhole fluid for circulating in the downhole fluid circuit. In this way, the geothermal properties of the aquifer may be leveraged for extracting and injecting heat in a similar way to the ground.

As mentioned, the downhole fluid circuit 110 includes a data center 114. The data center 114 may be a device, location, structure, building, facility, center, or other entity having one or more heat generating electronic components or devices. For instance, the data center 114 may include computers, servers, devices, machines, appliances, infrastructure, or other equipment for providing computing, storage, communication, or other services. The data center 114 may generate a quantity of heat energy. For example, the data center 114 may consume electricity for powering the devices and infrastructure of the data center, and may generate heat proportionate to (or substantially equivalent to) the electricity it consumes. Accordingly, the data center 114 may generate an amount of waste heat, and may require cooling to maintain data center equipment at a desired operating temperature.

The data center 114 may be included in the downhole fluid circuit 110 for cooling the data center 114 based on rejecting waste heat to the downhole fluid 118. For example, the data center 114 may include one or more heat exchangers for transferring heat from the heat-generating components to the downhole fluid 118. In accordance with at least one embodiment of the present disclosure, the data center 114 has a liquid cooling means for cooling the heat-generating components, such as single- or dual-phase immersion cooling systems. For instance, the heat-generating components of the data center 114 may be cooled through direct contact (or semi-direct contact such as with a cold plate) with a dielectric working fluid for rejecting heat to the working fluid, which may in turn reject heat to the downhole fluid 118, for example, through a heat exchanger. In some embodiments, these liquid and/or immersion cooling means may be advantageous in that cooling of the heat-generating components may be achieved with much higher fluid inlet temperatures, for example, as compared to non-liquid/immersion cooling means. For instance, in some embodiments, the downhole fluid circuit 110 may provide fluid temperatures that may be as high as 40° C. (104° F.). Operating temperatures of heat-generating components of the data center 114 may be much higher than 40° C. such that heat can be effectively rejected from these components to the (e.g., 40° C.) downhole fluid 118 via more direct (e.g., via a heat exchanger) immersion cooling means.

In contrast, some data centers may implement open air cooling to maintain an operational temperature of the data center and cool computing components. These indirect cooling techniques, for example, maintain a cool environmental temperature within the data center, such as at or below 22° C. (around 70° F.). This may typically be achieved through the use of computer room air conditioner (CRAC) units, chillers, dry coolers, etc., which typically consume a large amount of electricity and are highly inefficient. For instance, for each watt of electricity consumed by the data center, it may require as much as 1.3 watts of electricity to effectively cool the data center. Further, in order to implement (e.g., indirect) air-cooling in connection with a ground-source thermal system, such a system would need to implement lower downhole fluid temperatures, heat pumps, or some combination of both to effectively cool a data center with downhole fluid temperatures of up to 40° C., leading to inefficiencies. Thus, the data center 114 being cooled with liquid and/or immersion cooling techniques can advantageously leverage the downhole fluid temperatures of up to 40° C. or more for providing efficient cooling of the data center 114.

In some embodiments, the downhole fluid circuit 110 provides 100% (e.g., or substantially all) of the cooling for the data center 114 in this way. For instance, the data center 114 may not implement any auxiliary or supplemental cooling devices for providing cooling to the heat-generating components. In this way, all of the waste heat from the data center 114 may be rejected via the downhole fluid 118, leveraging the efficiency of the thermal system 100. Further, because all of the waste heat of the data center 114 is rejected into the downhole fluid circuit 110, an increased or maximum amount (and sometimes all) of the waste heat may be advantageously transferred to the facility 122 via the GSHP 116, reducing, minimizing (and sometimes eliminating) the need to extract heat from the ground via the BHE 112. As described herein, this may facilitate implementing a borefield of a smaller size, and may contribute to an increased efficiency of the GSHP 116 to transfer heat between the downhole fluid 118 and the facility fluid 124. The thermal system may further exhibit efficiencies based on waste heat from the data center being stored in the ground (e.g., during the summer) via the BHE 112 for providing to the facility during times of higher heating demand (e.g., during the winter).

The data center 114 may operate in this way based on the data center 114 being sized in conjunction with the BHE 112 and with respect to the thermal needs of the facility 122, as described herein. For instance, a power capacity of the data center 114 may be less than a thermal load (e.g., peak and/or annual) of the facility 122 in order to facilitate the data center waste heat being 100% rejected to the downhole fluid 118. Some conventional solutions may implement a data center in connection with a ground-source thermal system to leverage waste heat to heat buildings and other consumers. In contrast, however, these data centers may typically be massive in comparison to the facility(ies) they are heating (e.g., with a power capacity several orders of magnitude greater than the thermal loads of the facilities) such that only a small portion of the data center waste heat is transferred to the facilities. Accordingly, rejecting massive amounts of thermal energy (e.g., 100's of megawatts) to the ground through BHE's may be prohibitively difficult, expensive, and impractical, such that conventional data centers implement other auxiliary cooling means for rejecting waste heat. The data center 114, however, may be sized to reject 100% of its waste heat to the downhole fluid circuit 110, and additionally may operate continually at a full power capacity, for example, without having to shut down or throttle performance due to cooling needs not being met. For instance, the power capacity of the data center 114 may be within a same order of magnitude, or within 1 order of magnitude of a thermal load of the facility 122 (e.g., peak and/or annual) in order that the thermal system 100 is advantageously sized and/or dimensioned to operate extremely efficiently.

This optimal sizing of the data center 114 may facilitate the data center 114 (e.g., and the downhole fluid circuit 110 entirely) being implemented in a variety of situations. For instance, the data center 114 may be collocated with or at the facility (e.g., and the GSHP 116 and/or BHE 112). For instance, the data center 114 may be a computer or server room, may be in a mechanical room, or may be a separate building, site, or space, at or near the facility. In some embodiments, the data center 114 is an edge data center for providing low-latency computing services to nearby devices. The data center 114 may be collocated in this way based on the data center 114 being relatively smaller in size than the facility 122 as described herein. For example, the downhole fluid circuit 110 may be implemented in a neighborhood, on a company or college campus, etc., in order to provide computing services, as well as highly efficient heating and cooling. Such techniques and benefits cannot be reasonably implemented in connection with a typical, vast data center, for example, due to the large discrepancy between data center power capacity and facility thermal needs, difficulties with transferring thermal energy over large distances, etc. It should be understood, however, that large-scale implementations of the present techniques may be achieved, however, in accordance with the sizing and configuration techniques described herein.

Figures 1, 2:
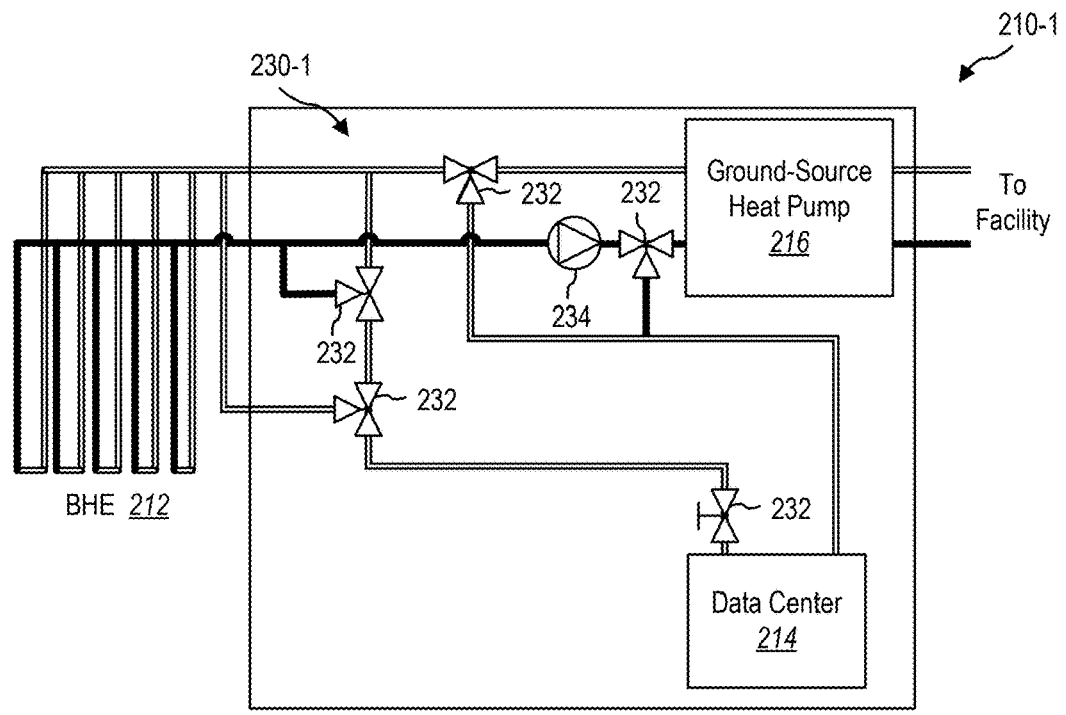
Figure 2:
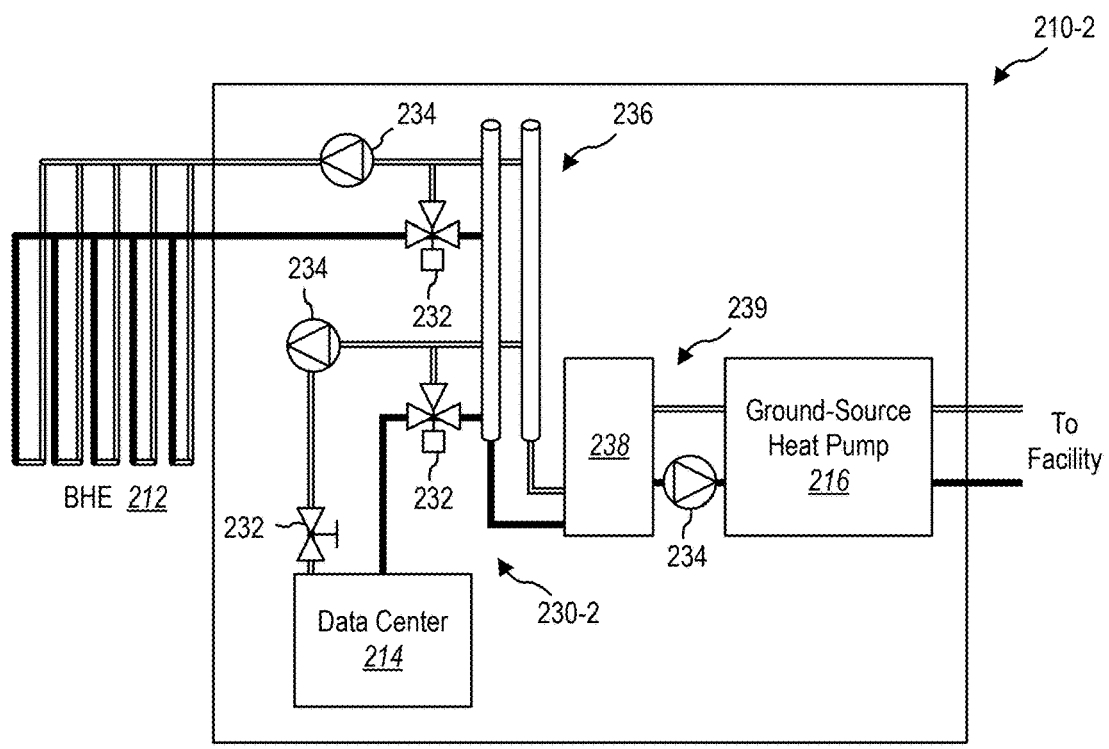

FIG. 2-1 illustrates an example downhole fluid circuit 210-1, according to at least one embodiment of the present disclosure. The downhole fluid circuit 210-1 may be an example embodiment of the downhole fluid circuit 110 of FIG. 1. For example, the downhole fluid circuit 210-1 includes a BHE 212, a data center 214, and a GSHP 216 for providing heating and/or cooling to a facility.

The BHE 212, the data center 214, and the GSHP 216 may be connected through one or more downhole fluid paths 230-1 for facilitating a flow of a downhole fluid to, through, and from one or more of the various components of the downhole fluid circuit 210-1. For example, the downhole fluid paths 230-1 may include one or more pipes, tubes, hoses, channels, or other fluid conduits for directing the flow of the downhole fluid. The downhole fluid circuit 210-1 may be configured to operate or implement a variety of different configurations of the downhole fluid paths 230-1. For example, FIGS. 3-1 through 6-2 illustrate various configurations or operating modes for a downhole fluid circuit, which may be implemented by virtue of the downhole fluid paths 230-1 of the downhole fluid circuit 210-1. For instance, the downhole fluid circuit 210-1 may include one or more valves 232. The valves 232 may be operable to configure the downhole fluid paths 230-1 such that the downhole fluid flows, and heat is transferred, between the various components of the downhole fluid circuit 210-1 as described herein, for example, by opening, closing, routing, directing, or otherwise configuring the downhole fluid paths 230-1 to direct the flow of the downhole fluid in certain ways. The valves 232 may be any type of valve such as ball valves, butterfly valves, needle valves, globe valves, etc., and may be any configuration of valves, such as 2-way valves, 3-way valves, 4-way valves, shutoff valves, modulating valves, etc. The valves may be selectively operated in that any valve or combination of valves may be selectively opened, closed, modulated, or otherwise actuated to facilitate implementing the fluid paths described herein. The downhole fluid circuit 210-1 may include one or more circulation pumps 234 for flowing the downhole fluid through the downhole fluid paths 230-1 in one or more configurations.

The downhole fluid circuit 210-1 may be implemented to provide both a hot flow of downhole fluid and/or a cold flow of downhole fluid to one or more components. For example, in some embodiments, the downhole fluid circuit 210-1 is implemented to provide a cold flow of downhole fluid to the data center 214, and accordingly, the data center 214 returns or outputs a hot flow of downhole fluid. In some embodiments, a hot flow of downhole fluid is provided to the GSHP 216 and the GSHP 216 accordingly returns or outputs a cold flow of fluid. In some embodiments, the BHE 212 receives a cold flow of downhole fluid and provides a hot flow, or vice versa.

The downhole fluid circuit 210-1 should be understood as illustrating one embodiment of a downhole fluid circuit for facilitating the configuration of the ground-source thermal systems described herein, and alternative embodiments may be implemented for configuring a downhole fluid circuit to facilitate the techniques described herein. For example, more or less valves 232 and/or pumps 234 may be included at any location or position in order to provide the flow of downhole fluid to the various components and achieve the transfer of heat as described herein.

FIG. 2-2 illustrates an example downhole fluid circuit, 210-2, according to at least one embodiment of the present disclosure. The downhole fluid circuit 210-2 may be an example embodiment of the downhole fluid circuit 110 of FIG. 1. The downhole fluid circuit, 210-2 may be similar to the downhole fluid circuit 210-1 in one or more respect, and/or may include any of the features, components, or functionality of the downhole fluid circuit 210-2. For example, the downhole fluid circuit 210-2 includes the BHE 212, the data center 214, and the GSHP 216. The downhole fluid circuit 210-2 includes one or more downhole fluid paths 230-2 through which the downhole fluid may flow to one or more of the components of the downhole fluid circuit 210-2. For instance, the downhole fluid paths 230-2 may be implemented and/or configurable via one or more valves 232 and/or pumps 234.

The downhole fluid circuit 210-2 may include one or more manifolds 236 or common receptacles for directing, consolidating, accumulating, or reducing various flows of the downhole fluid into a common flow. For instance, a hot or warm output of the BHE 212 and of the data center 214 may be connected via a manifold for providing a common hot or warm flow of the downhole fluid to the GSHP 216. In another example, a cold or cool input to the BHE 212 and to the data center 214 may be connected via a manifold 236 for receiving a common cold or cool flow of the downhole fluid from the GSHP 216. Other examples may include the various inputs and outputs, relative temperatures of flows, directions of flows, etc. organized or configured in any other way via the manifolds 236. In some embodiments, the manifolds 236 may connect the BHE and the data center 214 in parallel (e.g., for at least one configuration or operating mode of the downhole fluid circuit 210-2).

The downhole fluid circuit 210-2 may include a decoupling tank 238. The decoupling tank 238 may be associated with the GSHP 216 and may serve as an intermediary between the GSHP 216 and the downhole fluid paths 230-2 distributing the downhole fluid. The decoupling tank 238 may decouple the GSHP 216 from the flow rate, heat transfer rate, etc., of the downhole fluid distribution in order to facilitate a desired heat transfer rate for the GSHP 216 and to minimize temperature fluctuations. For instance, the decoupling tank 238 may act as a buffer, storing heat during periods of low demand and releasing stored heat during periods of high demand. In some embodiments, the decoupling tank 238 is connectable to a heat exchanger for exchanging heat with an intermediate fluid in an intermediate fluid loop 239 between the decoupling tank 238 and the GSHP 216. In this way, the downhole fluid may, in some embodiments, not flow or interact directly with the GSHP 216.

Figures 1, 3:
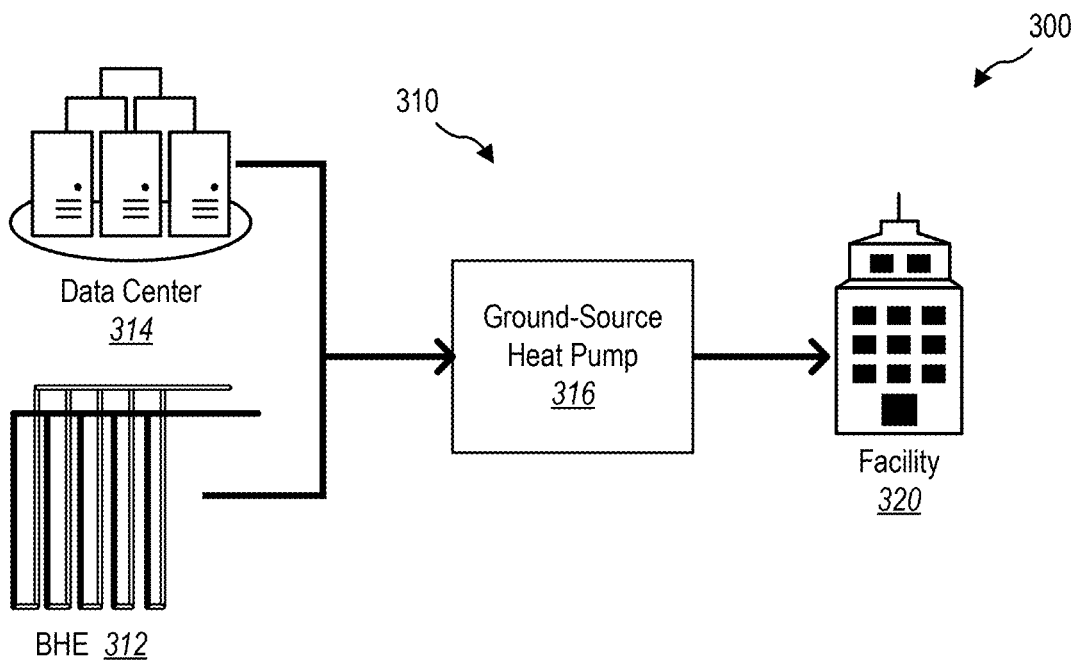
Figures 2, 3:
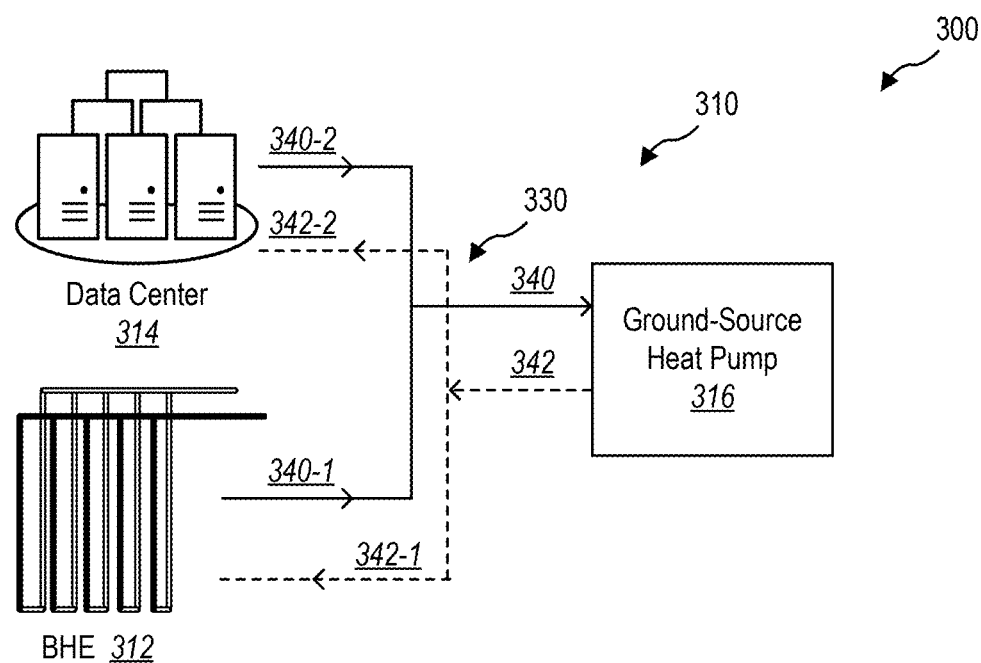
Figure 3:
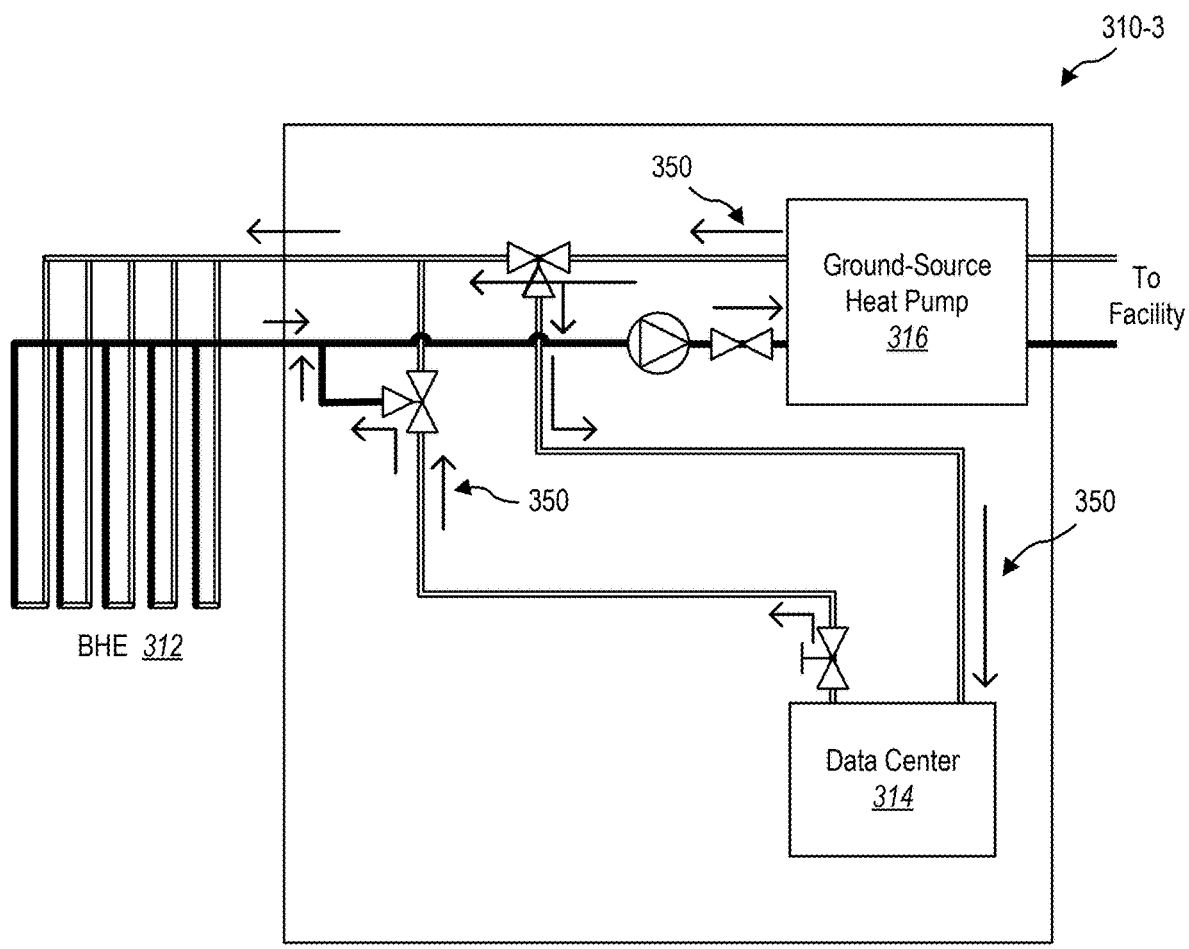

FIGS. 3-1 and 3-2 illustrate an example configuration 300 or operating mode of a downhole fluid circuit 310, according to at least one embodiment of the present disclosure. The downhole fluid circuit 310 includes a BHE 312, a data center 314, and a GSHP 316 connected via a flow of a downhole fluid for providing conditioning to a facility 320 through the GSHP 316.

In the configuration 300, the downhole fluid circuit 310 is configured to provide heating to the facility 320 (e.g., via the GSHP 316) from both the data center 314 and the BHE 312. For instance, the downhole fluid circuit 310 is configured with a set of fluid paths 330 for directing the downhole fluid to flow between the BHE 312, the data center 314, and the GSHP 316. The fluid paths 330 may be implemented based on one or more valves and/or pumps for directing the flow of the downhole fluid in accordance with the configuration 300, such as that described in connection with FIGS. 2-1 and 2-2 (or any other configuration).

In some embodiments, the BHE 312 and the data center 314 may be configured in parallel with each other and may each be connected to the GSHP 316. For instance, heat may be extracted from the ground via the BHE 312 and may be transferred from the BHE 312 via a hot flow 340-1 of the downhole fluid from the BHE 312. Similarly, heat may be rejected from the data center 314 (e.g., to cool the data center 314) and may be transferred from the data center 314 via a hot flow 340-2 of the downhole fluid from the data center 314. The hot flows 340-1 and 340-2 may join to form a hot flow 340 provided to the GSHP 316 for extracting heat from the hot flow 340 and providing to the facility 320. After extracting heat, a cold flow 342 of the downhole fluid may flow from the GSHP 316, wherein it may be separated into corresponding cold flows 342-1 and 342-2 for flowing back to the BHE 312 and data center 314, respectively.

In this way, heat may be extracted, rejected, or otherwise transferred from the BHE 312 and from the data center 314 to the GSHP 316 for heating the facility 320. The amount of heat transferred from the BHE 312 and the data center 314 may be the same or may be different. In the configuration 300, the data center 314 rejects all of its waste heat to the downhole fluid circuit 310, and accordingly to the GSHP 316. In this way, the configuration 300 may efficiently leverage the waste heat of the data center 314 to advantageously cool the data center 314 and to heat the facility 320 to the furthest extent possible, and may supplement any additional thermal needs (e.g., heating the facility 320 above that which the data center waste heat provides) by the BHE 312 maintaining a thermal balance or temperature of (e.g., supplying additional heat to) the thermal fluid.

FIG. 3-3 illustrates a downhole fluid circuit 310-3 for implementing the example configuration 300 as described in connection with FIGS. 3-1 and 3-2, according to at least one embodiment of the present disclosure. The downhole fluid circuit 310-3 may be substantially similar to the downhole fluid circuit 210-1 of FIG. 2-1, and may have various valves configured to direct various flows 350 of the downhole fluid as shown in order to achieve the example configuration 300.

Figures 1, 4:
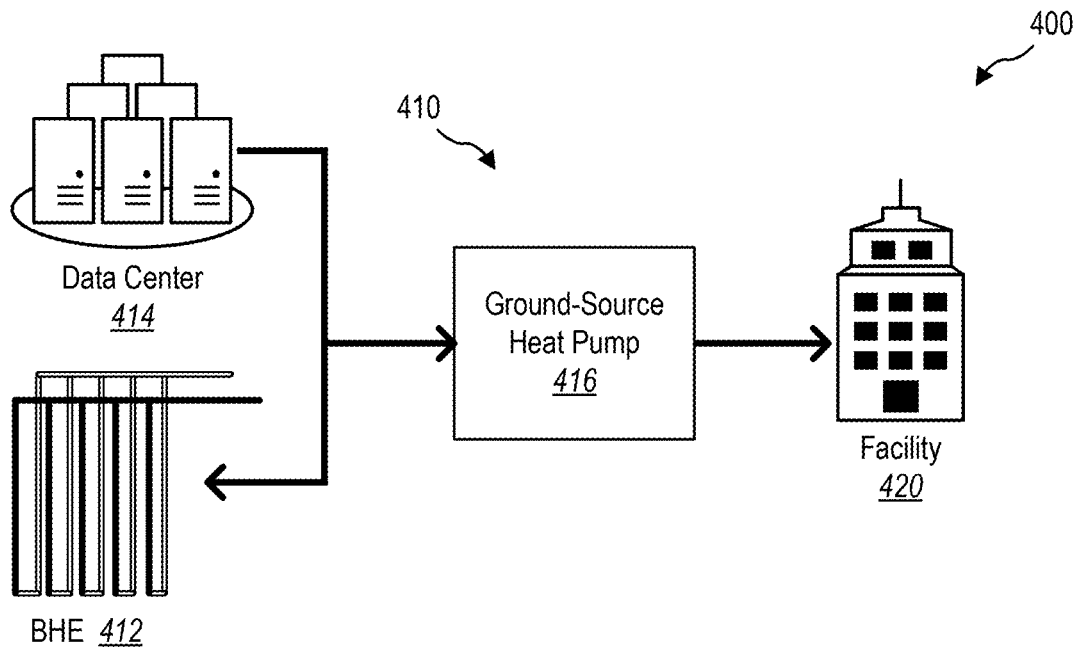
Figures 2, 4:
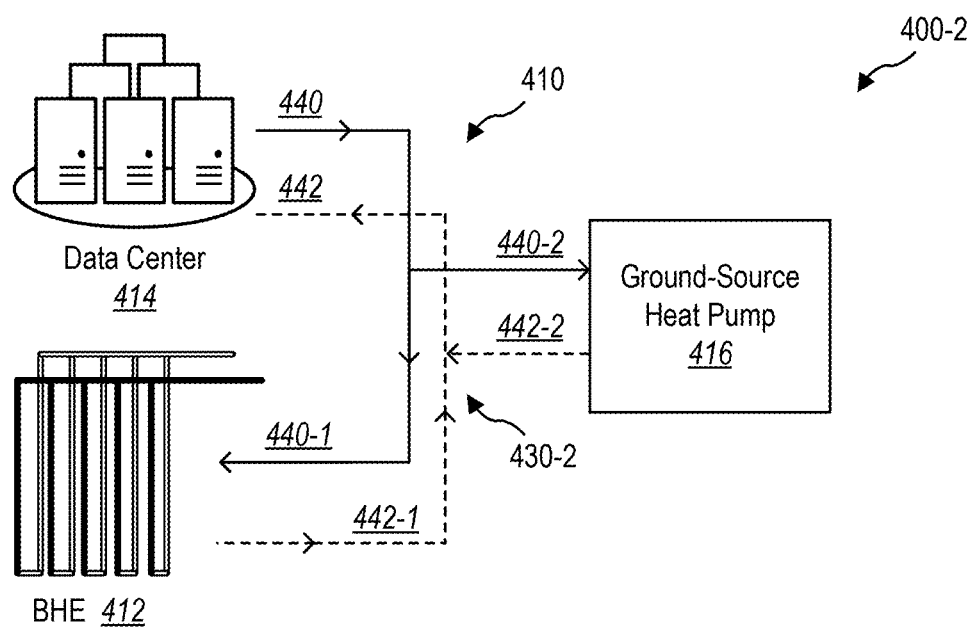
Figures 3, 4:
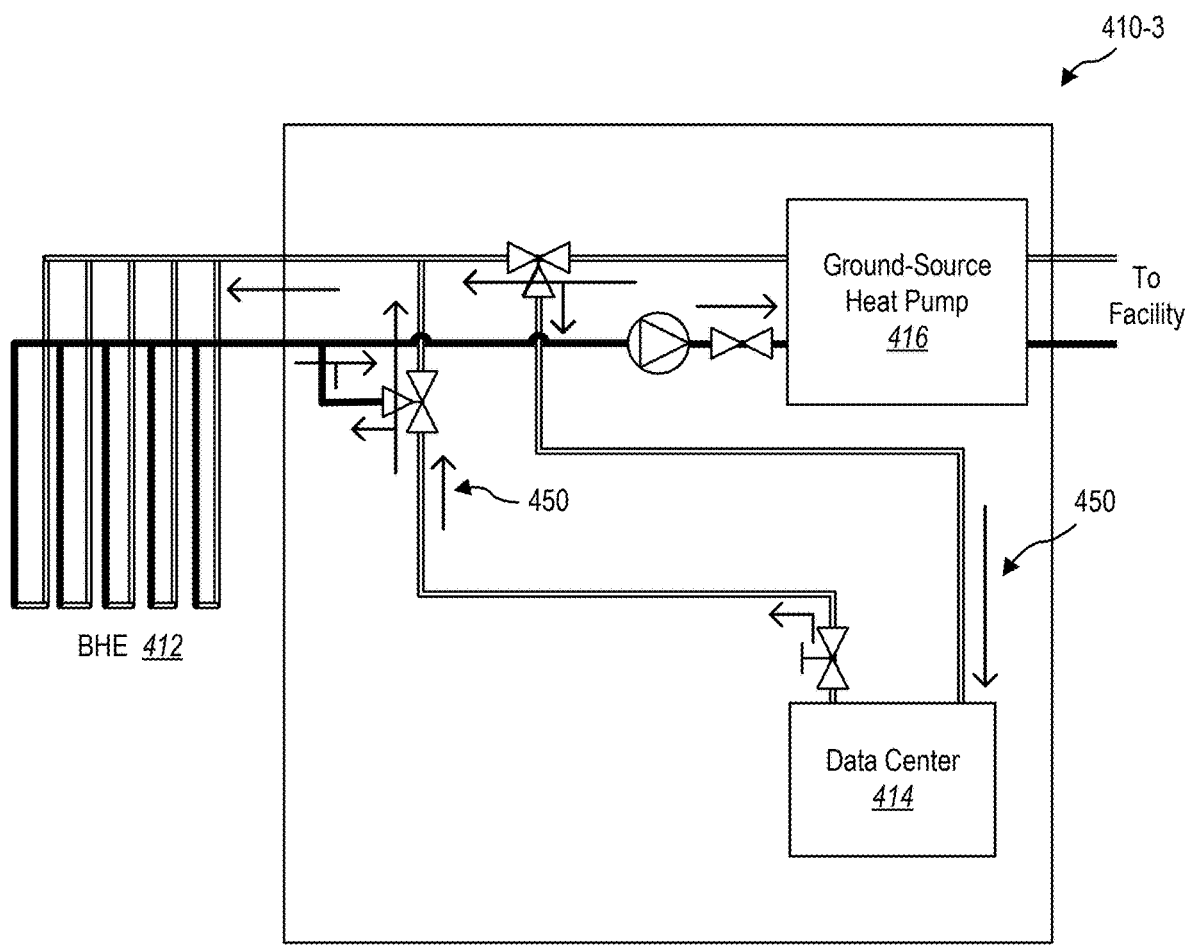

FIG. 4-1 illustrates an example configuration 400 or operating mode of a downhole fluid circuit 410, according to at least one embodiment of the present disclosure. The downhole fluid circuit 410 includes a BHE 412, a data center 414, and a GSHP 416 connected via a flow of a downhole fluid for providing conditioning to a facility 420 through the GSHP 416.

In the configuration 400, the downhole fluid circuit 410 is configured to provide heating to the facility 420 (e.g., via the GSHP 416) from the data center 414, as well as to reject heat from the data center 414 to the BHE 412. The downhole fluid circuit 410 may be configured in this way based on a configuration 400-2 of fluid paths 430-2 as shown in FIG. 4-2, for directing the downhole fluid to flow between the BHE 412, the data center 414, and the GSHP 416. The fluid paths 430-2 and configuration 400-2 may be implemented based on one or more valves and/or pumps for directing the flow of the downhole fluid in accordance with the configuration 400, such as that described in connection with FIGS. 2-1 and 2-2 (or any other configuration).

In the configuration 400, the data center 414 rejects all of its waste heat to the downhole fluid circuit 410, and accordingly to the GSHP 416 and/or BHE 412. In this way, the configuration 400 may efficiently leverage the waste heat of the data center 414 to the furthest extent possible to advantageously cool the data center 414 and heat the facility via the GSHP 416, and may supplement any additional thermal needs (e.g., rejection of excess waste heat from the data center 414 above that which the facility needs) by using the BHE 312.

In some embodiments, the data center 414 rejects heat based on flowing the downhole fluid to both the GSHP 416 and the BHE 412. For example, the GSHP 416 and the BHE 412 may be in parallel with each and may be connected to the data center 414. For instance, as shown in FIG. 4-2, heat may be rejected from the data center 414 to a hot flow 440 of the downhole fluid. The hot flow 440 may be split or separated into a hot flow 440-1 and a hot flow 440-2 of the downhole fluid that may flow, respectively, to the BHE 412 and to the GSHP 416. The GSHP 416 may extract heat from the hot flow 440-2 and may accordingly generate a cold flow 442-2. Similarly, the BHE 412 may extract heat from the hot flow 440-1 and generate a cold flow 442-1. The cold flows 442-1 and 442-2 may join together to form a cold flow 442, which may be provided back to the data center 414 to cool the data center 414.

In this way, heat may be extracted, rejected, or otherwise transferred from the data center 414 to the GSHP 416 for heating the facility 420, and any excess heat (e.g., above a thermal load of the facility 420) is transferred to the BHE 412. In other words, the BHE 412 may maintain a thermal balance or temperature of the downhole fluid and may extract any excess or remaining heat that is not extracted by the GSHP 416. The amount of heat transferred to the GSHP 416 and to the BHE 412 may be the same or may be different. For instance, the fluid paths 430-2 may include one or more sensors, valves, and/or pumps that may monitor the heat generated and/or rejected by the data center 414, as well as thermal load of the facility 420, and may accordingly direct a proportionate amount of the hot flow 440 of the downhole fluid to the GSHP 416. In this way, only so much of the heat (e.g., downhole fluid) rejected by the data center 414 may be directed or flowed to the GSHP as the facility needs (e.g., based on a controlled flow rate of the hot flow 440-2 to the GSHP 416), with the rest being transferred to the BHE 412. In some embodiments, more heat may be rejected to the GSHP 416 than to the BHE 412, or vice versa. In some embodiments, all of the heat rejected by the data center 414 may be transferred to the GSHP 416, for example, with substantially no heat being transferred to the BHE. For instance, substantially no downhole fluid may flow to and/or from the BHE 412 as the hot flow 440-1 and/or cold flow 442-1, and substantially all of the hot flow 440 and cold flow 442 may flow from the data center 414 to the GSHP 416 based on the thermal capacity of the data center 414 being substantially equal to the thermal load of the facility 420.

FIG. 4-3 illustrates a downhole fluid circuit 410-3 for implementing the example configuration 400 as described in connection with FIG. 4-1, according to at least one embodiment of the present disclosure. The downhole fluid circuit 410-3 may be substantially similar to the downhole fluid circuit 210-1 of FIG. 2-1, and may have various valves configured to direct various flows 450 of the downhole fluid as shown in order to achieve the example configuration 400.

Figures 1, 5:
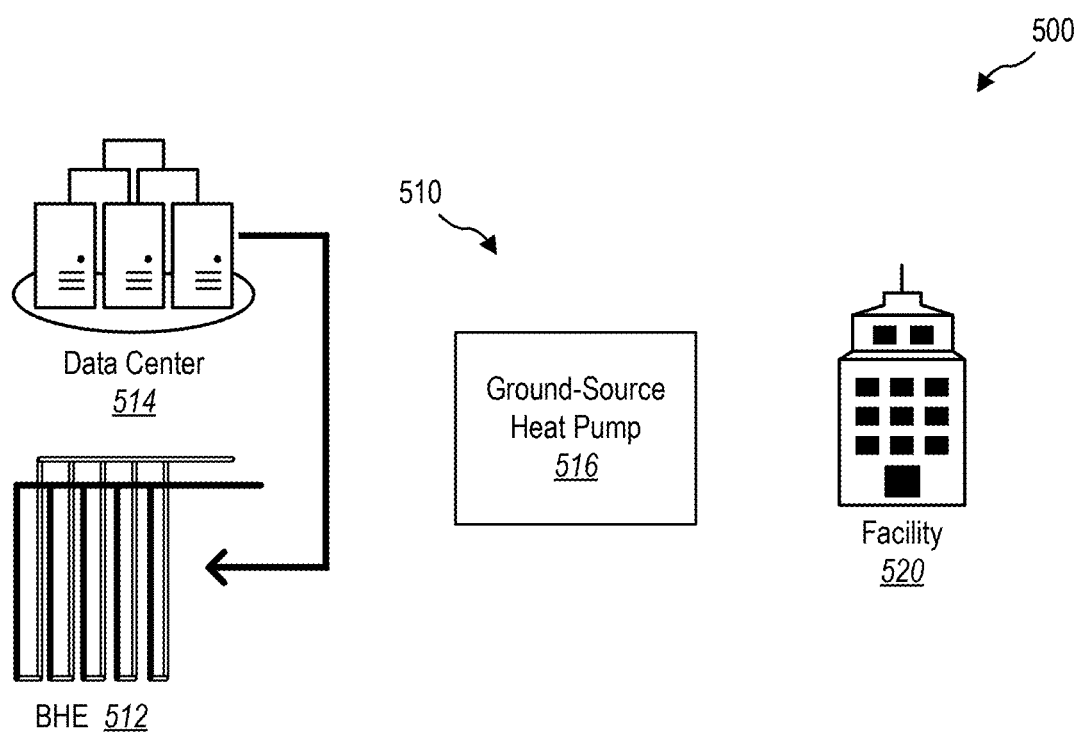
Figures 2, 5:
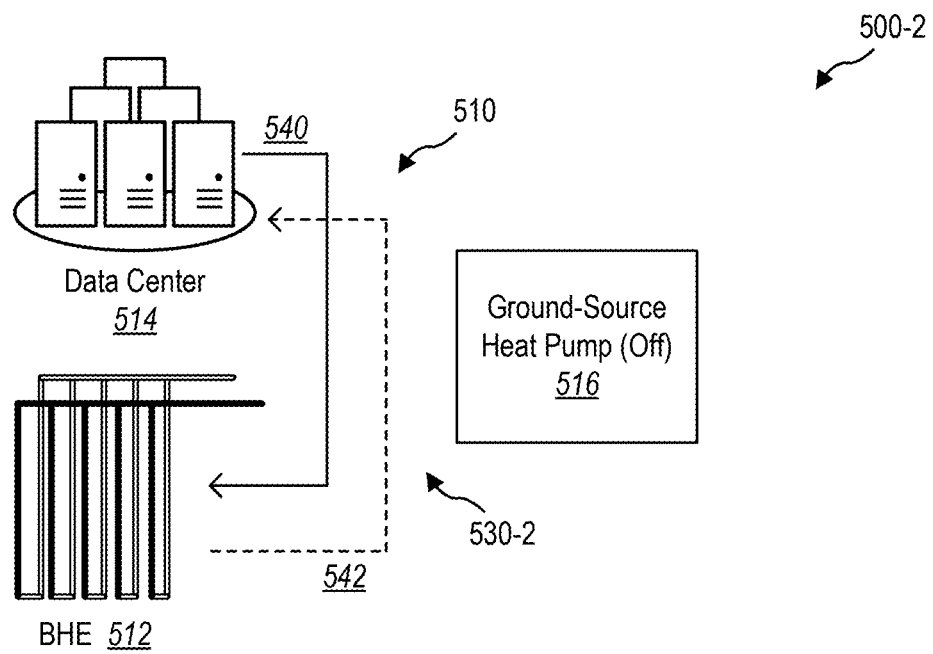
Figures 3, 5:
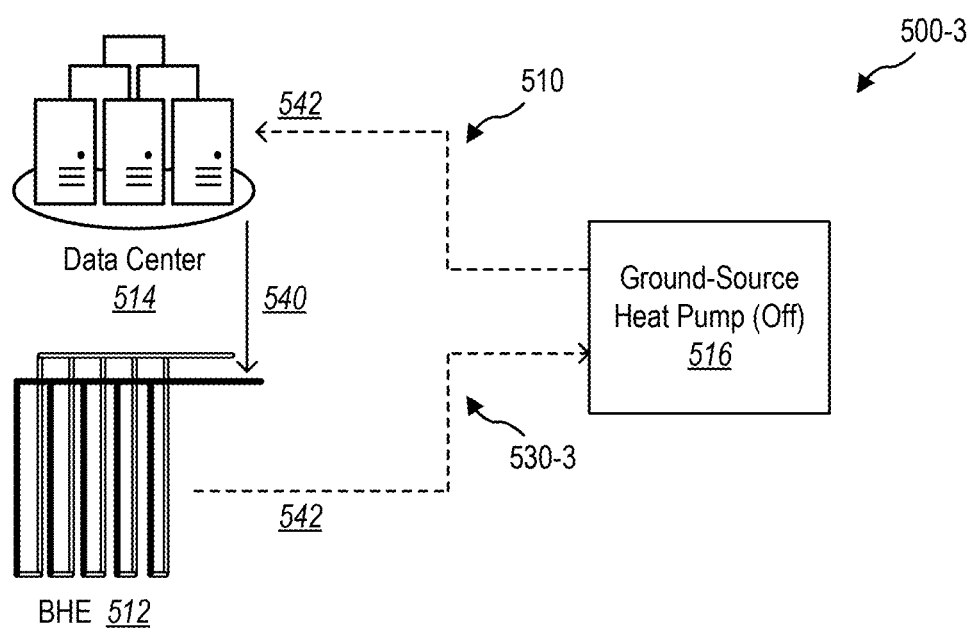
Figures 4, 5:
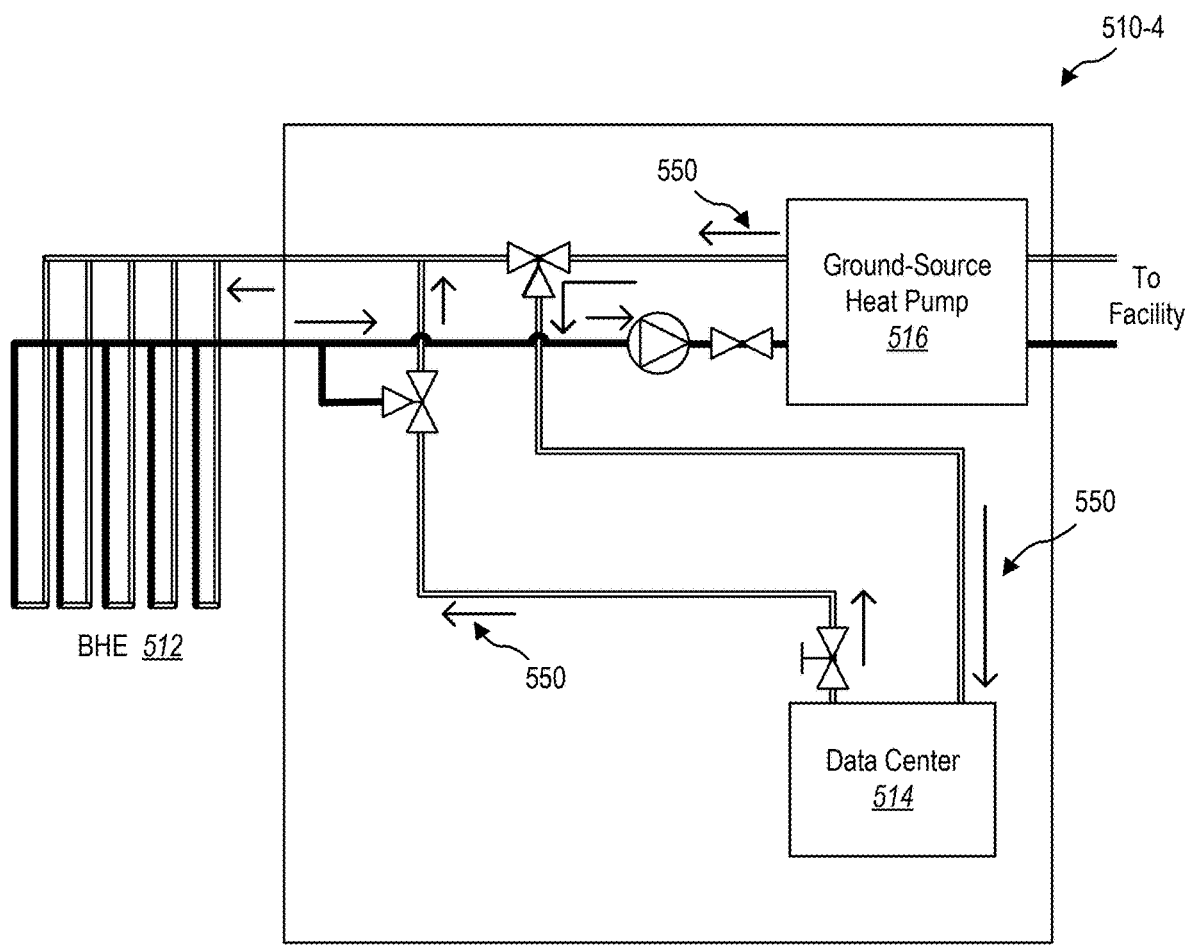

FIG. 5-1 illustrates an example configuration 500 or operating mode of a downhole fluid circuit 510, according to at least one embodiment of the present disclosure. The downhole fluid circuit 510 includes a BHE 512, a data center 514, and a GSHP 516 connected via a flow of a downhole fluid for providing conditioning to a facility 520 through the GSHP 516.

In the configuration 500, the downhole fluid circuit 510 is configured to provide cooling for the data center 514 without any corresponding heating to the GSHP 516. The downhole fluid circuit 510 may be configured in this way based on a configuration 500-2 of fluid paths 530-2 as shown in FIG. 5-2, or a configuration 500-3 of the fluid paths 530-3 as shown in FIG. 5-3, for directing the downhole fluid to flow between the BHE 512, the data center 514, and with respect to the GSHP 516. The fluid paths 530-2 and 530-3 and configurations 500-2 and 500-3 may be implemented based on one or more valves and/or pumps for directing the flow of the downhole fluid in accordance with the configuration 500, such as that described in connection with FIGS. 2-1 and 2-2 (or any other configuration).

In the configuration 500, the data center 514 rejects all of its waste heat to the downhole fluid circuit 510, and accordingly to the BHE 512. In this way, the configuration 500 may leverage the thermal resources within the ground for efficiently cooling the data center 514, for example, as opposed to other, less efficient cooling techniques such as air conditioners, chillers, dry coolers, air-source heat pumps, etc. For instance, the BHE 512 may maintain a thermal balance or temperature of the downhole fluid and may directly extract the heat from the downhole fluid that the data center 514 rejects to the downhole fluid. This may facilitate a continued operation of the data center 514, for example, in instances where the facility 520 has substantially no thermal load. For example, should the facility 520 not need any heating, and accordingly, none of the waste heat from the data center 514 is rejected through the GSHP 516, in some cases the data center would have to shut down, throttle performance, or implement other complemental, inefficient cooling means for cooling the data center 514 (or combinations). By sizing and configuring together the data center 514 and the BHE 512 as described herein, the data center 514 may operate at a continual and full power capacity despite the facility 520 having substantially no thermal load.

In some embodiments, the data center 514 rejects heat based on flowing the downhole fluid (e.g., directly to) the BHE 512, for example, by bypassing the GSHP 516. For example, the data center 514 and the BHE 512 may be connected in a closed loop and the GSHP 516 may not be connected to the closed loop. In this way, the data center 514 may reject heat to the downhole fluid to generate a hot flow 540, which may flow directly (i.e., bypassing the GSHP 516) to the BHE 512. Heat may accordingly be rejected to the ground through the BHE 512 to generate a cold flow 542 (e.g., the BHE 512 may maintain a thermal balance or temperature of the downhole fluid), which may then flow back to the data center 514.

In some embodiments, the data center 514 rejects heat based on flowing the downhole fluid to the BHE 512, and then to the GSHP 516. For example, the data center 514, the GSHP 516, and the BHE 512 may all be connected in series. For instance, as shown in FIG. 5-3, heat may be rejected from the data center 514 to a hot flow 540 of the downhole fluid. The (e.g., entirety of the) hot flow 540 may flow from the data center 514 to the BHE 512 where it may be rejected to the ground. Accordingly, the BHE 512 may generate or output a cold flow 542 to the GSHP 516. However, despite receiving a flow of the downhole fluid, the GSHP 516 may be turned off, or otherwise may not be operated to exchange heat with the downhole fluid. Accordingly, the cold flow 542 may flow from the GSHP 516 to the data center 514 without substantially any change in temperature. In this way, the configuration 500 may be implemented or achieved in a variety of different ways and based on a variety of different flow paths of the downhole fluid, such as that shown in FIGS. 5-2 and 5-3.

FIG. 5-4 illustrates a downhole fluid circuit 510-4 for implementing the example configuration 500 as described in connection with FIG. 4-1, according to at least one embodiment of the present disclosure. The downhole fluid circuit 510-4 may be substantially similar to the downhole fluid circuit 210-1 of FIG. 2-1, and may have various valves configured to direct various flows 550 of the downhole fluid as shown in order to achieve the example configuration 500.

Figures 1, 6:
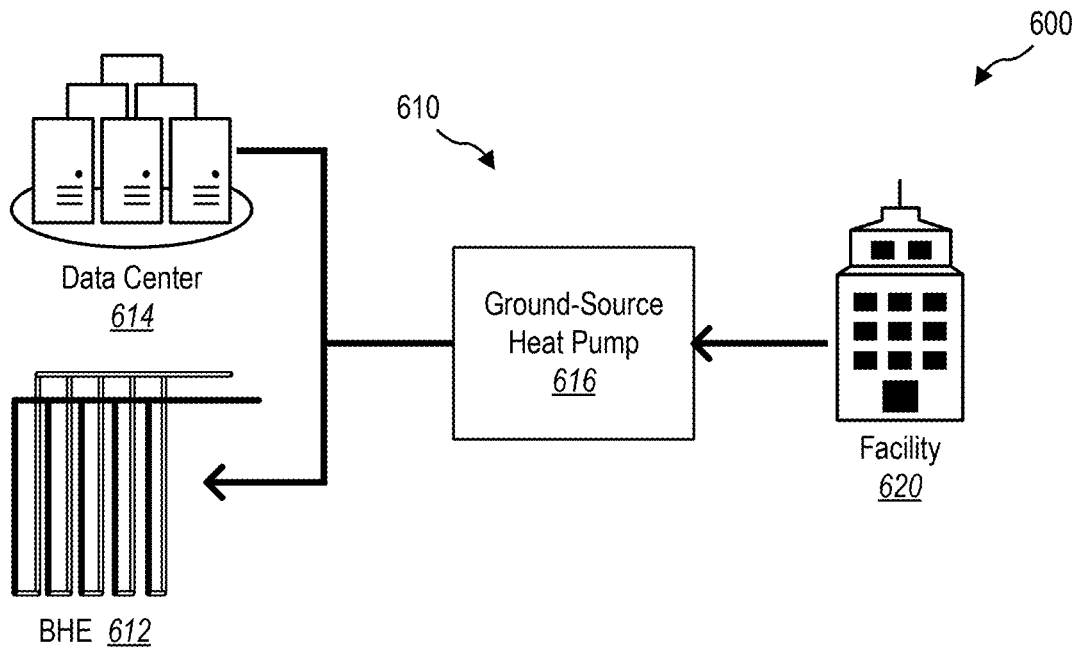
Figures 2, 6:
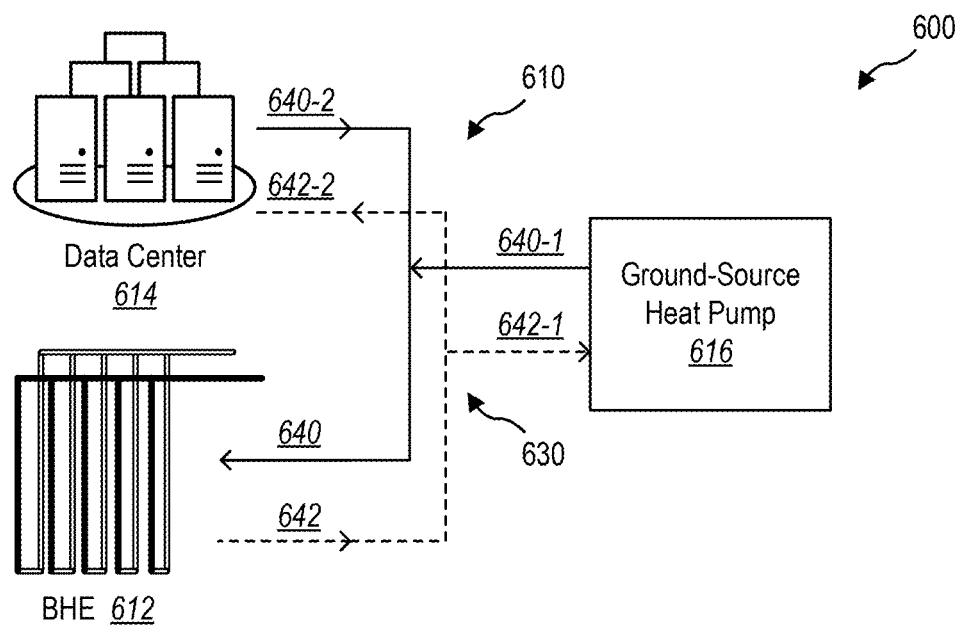
Figures 3, 6:
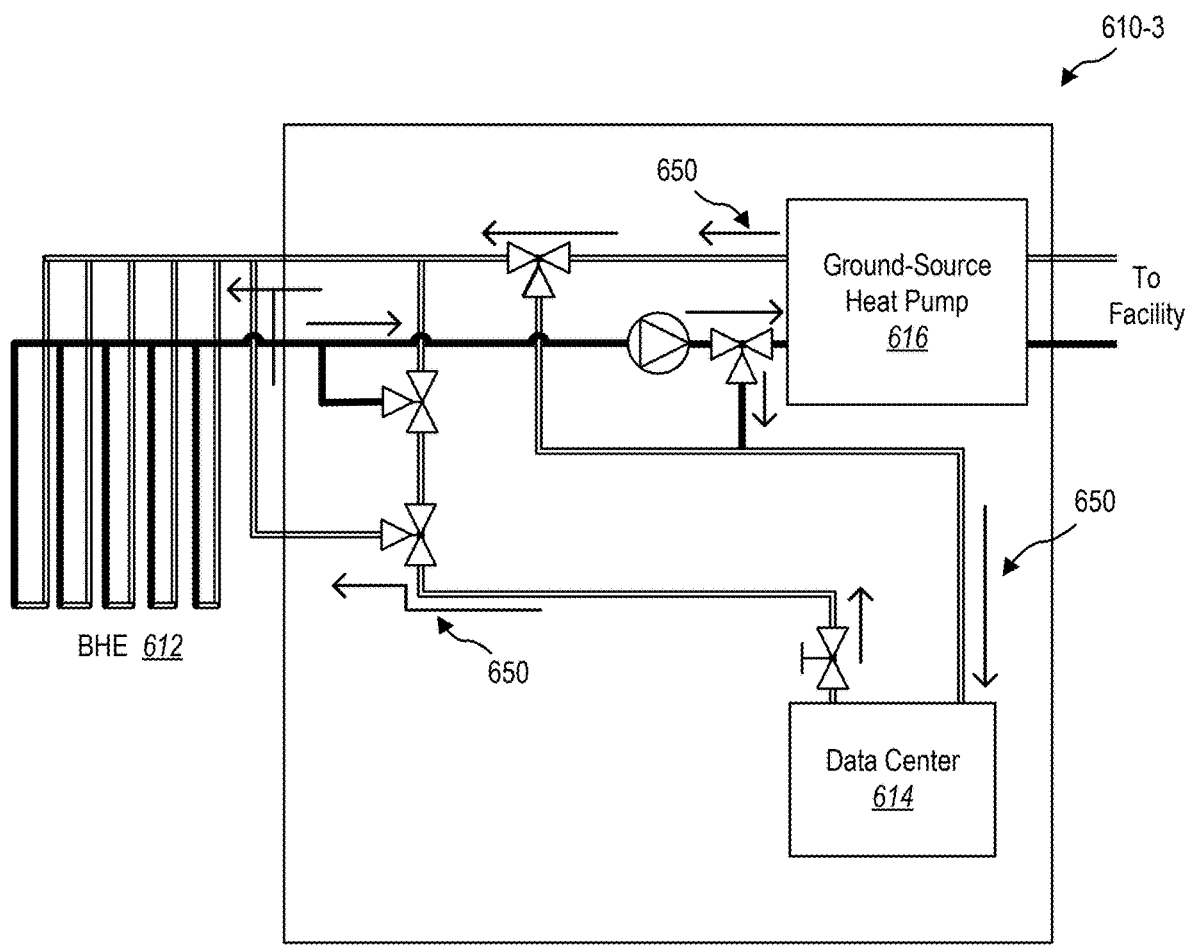
Figures 4, 6:
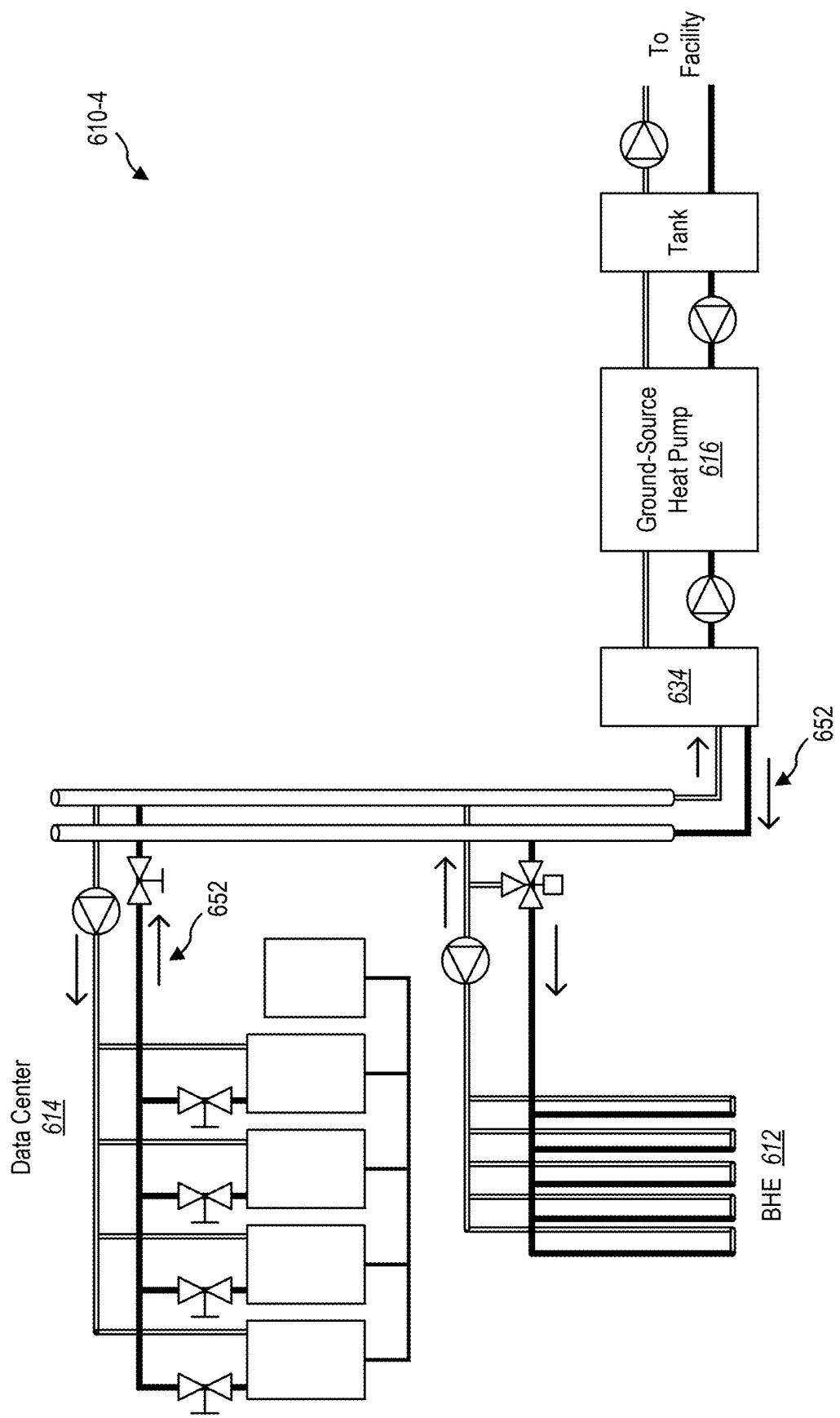

FIG. 6-1 illustrates an example configuration 600 or operating mode of a downhole fluid circuit 610, according to at least one embodiment of the present disclosure. The downhole fluid circuit 610 includes a BHE 612, a data center 614, and a GSHP 616 connected via a flow of a downhole fluid for providing conditioning to a facility 620 through the GSHP 616.

In the configuration 600, the downhole fluid circuit 610 is configured to reject heat from the data center 614 and from the facility 620 (via the GSHP 616) to the BHE 612. For instance, the downhole fluid circuit 610 is configured with a set of fluid paths 630 for directing the downhole fluid to flow between the BHE 612, the data center 614, and the GSHP 616. The fluid paths 630 may be implemented based on one or more valves and/or pumps for directing the flow of the downhole fluid in accordance with the configuration 600, such as that described in connection with FIGS. 2-1 and 2-2 (or any other configuration).

In the configuration 600, the data center 614 rejects all of its waste heat to the downhole fluid circuit 610, and accordingly to the BHE 612. Additionally, the facility 620 rejects all (or at least a threshold level as described herein) of its waste heat to the downhole fluid circuit 610. In this way, the configuration 600 may leverage the thermal resources within the ground for efficiently cooling the data center 614 and the facility 620, for example, as opposed to other, less efficient cooling techniques such as air conditioners, chillers, dry coolers, air-source heat pumps, etc. For example, the BHE 612 may maintain a thermal balance or temperature of the downhole fluid in order that heat may be rejected from the data center 614 and the GSHP 616 to the ground through the downhole fluid. This may facilitate a continued operation of the data center 614, for example, in instances where the facility 620 has substantially no thermal load. This may also facilitate the cooling of the facility 620 with efficient ground-source resources, for example, as opposed to less-efficient cooling device.

In some embodiments, the data center 614 and the GSHP 616 are configured in parallel with each other and may each be connected to the BHE 612. For instance, heat may be rejected from the facility 620 via the GSHP 616 and may be transferred to a hot flow 640-1 of the downhole fluid from the GSHP 616. Similarly, heat may be rejected from the data center 614 and may be transferred from the data center 614 via a hot flow 640-2 of the downhole fluid from the data center 614. The hot flows 640-1 and 640-2 may join to form a hot flow 640 provided to the BHE 612 for efficiently rejecting to the ground. After extracting heat, a cold flow 642 of the downhole fluid may flow from the BHE 612, wherein it may be separated into corresponding cold flows 642-1 and 642-2 for flowing back to the GSHP 616 and data center 614, respectively.

FIG. 6-3 illustrates a downhole fluid circuit 610-3 for implementing the example configuration 600 as described in connection with FIG. 6-1, according to at least one embodiment of the present disclosure. The downhole fluid circuit 610-3 may be substantially similar to the downhole fluid circuit 210-1 of FIG. 2-1, and may have various valves configured to direct various flows 650 of the downhole fluid as shown in order to achieve the example configuration 600.

FIG. 6-4 illustrates a downhole fluid circuit 610-4 for implementing the example configuration 600 as described in connection with FIG. 6-1, according to at least one embodiment of the present disclosure. The downhole fluid circuit 610-4 may be substantially similar to the downhole fluid circuit 210-2 of FIG. 2-2, and may have various valves configured to direct various flows 652 of the downhole fluid as shown in order to achieve the example configuration 600.

In this way, as shown in FIGS. 3-1 through 6-3, a downhole fluid circuit may be configured to operate in a variety of different modes for providing heating and/or cooling to and through the various components of the downhole fluid circuit. For example, a downhole fluid circuit in accordance with the present disclosure may implement any, several, or all of the configurations or operating modes described herein. In this way, a downhole fluid circuit may be a dynamic downhole fluid circuit that may be dynamically changed or switched to operate in different modes, to flow the downhole fluid in different flow paths, and ultimately to transfer heat between the various components in different directions and in different quantities based on changing circumstances and/or needs of the data center and/or facility. Indeed, any of the downhole fluid circuits may be dynamically switched to operate between any of the configurations or operating modes described herein, such as the configurations 300-600 of FIGS. 3-1 through 6-3.

The various configurations of a downhole fluid circuit described herein (e.g., whether implemented singly or dynamically switched between several different configurations) may facilitate an efficient use of resources. For example, waste heat from the data center 614 (and in some cases substantially all of the waste heat) is efficiently converted into heating for the facility such that energy (e.g., electricity, gas, etc.) that would otherwise be used to cool the data center and to heat the facility is significantly reduced (e.g., or nearly eliminated). Indeed, the elevated temperatures of the downhole fluid that the data center 314 can provide (e.g., up to 40° C.) can result in a highly efficient operation of the GSHP 316 for heating the facility, such that a minimal amount of electricity may be required to both cool the data center and heat the facility, as compared to cooling and heating these components with conventional (e.g., non-heat pump) means. Additionally, the various configurations of the downhole fluid circuit may facilitate implementation with a BHE having a smaller size or smaller total drilled length, for instance, in comparison to a ground-source thermal system that does not implement a data center in this way. For example, because the BHE, in several configurations, is not implemented to provide all of the cooling of the data center, nor all of the heating of the facility, but rather is advantageously implemented to maintain a thermal balance or an operating temperature of the downhole fluid as a supplemental or auxiliary source of heating and cooling, the overall size of the BHE can be greatly reduced.

Further, even in configurations where cooling of both the data center and the facility is provided by the BHE, such configurations can still be implemented with a significantly smaller borefield of the BHE based on a geographical location and/or climate where the thermal system is implemented. For example, in some cases, the thermal systems described herein may be especially applicable or uniquely advantageous in cooler climates, such as climates of northern Europe, northern North America, etc. To elaborate, the thermal systems described herein may be advantageous for facilities that have thermal loads that are heating dominant, such as having heating loads that are at least double (or more) that of the cooling loads. These climates may be those that have an average annual temperature of about 20° C. or below (about 68° F.), about 15° C. or below (about 60° F.), about 10° C. (about 50° F.) or below, or any other climate characterized as cooler. Put another way, the present techniques may be beneficial for implementation in climates having about 5400 heating degree days or more.

As an example, in colder climate areas, ground-source thermal systems may typically be implemented to provide heating to facilities based on extracting heat from the ground through a BHE, similar to that described herein. Because these systems provide much more heating than cooling, more heat is extracted from the ground (e.g., during many cold months) than is injected into the ground (e.g., during fewer warm months) if at all. Accordingly, these systems may typically be accompanied by a decline in the average ground temperature as heat is continually extracted from the ground without sufficiently injecting heat back into the ground. Indeed, in many countries, regulatory thresholds (e.g., upper and lower threshold temperatures) governing the ground temperatures and borefield inlet temperatures may present serious limitations to the efficacy of such systems, requiring a sizable borefield to spread the decline in ground temperature over a given time period (e.g., also usually governed by regulations, such as a 25- or 50-year period).

Figures 1, 7:
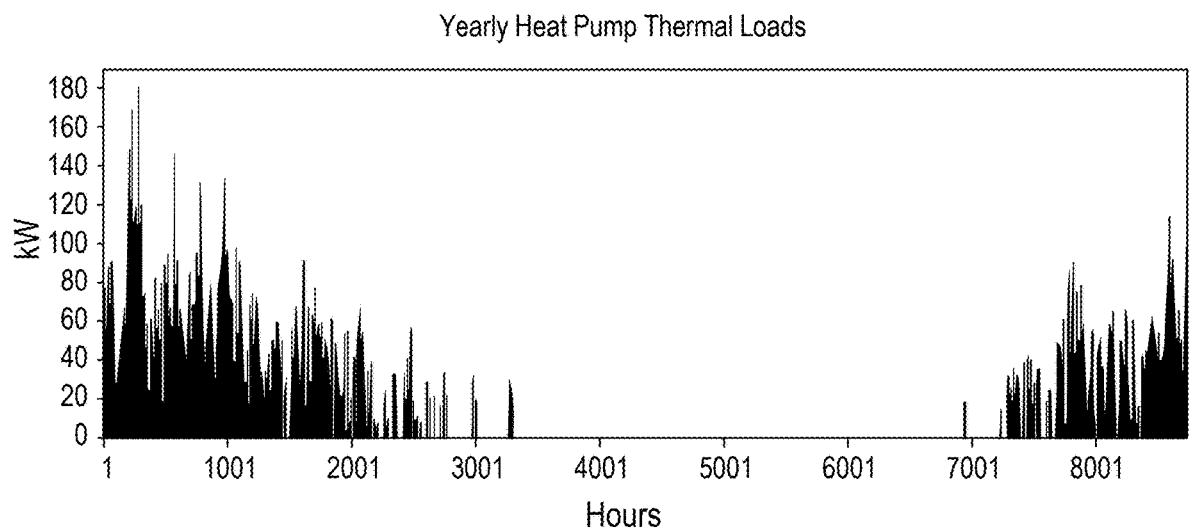
Figures 2, 7:
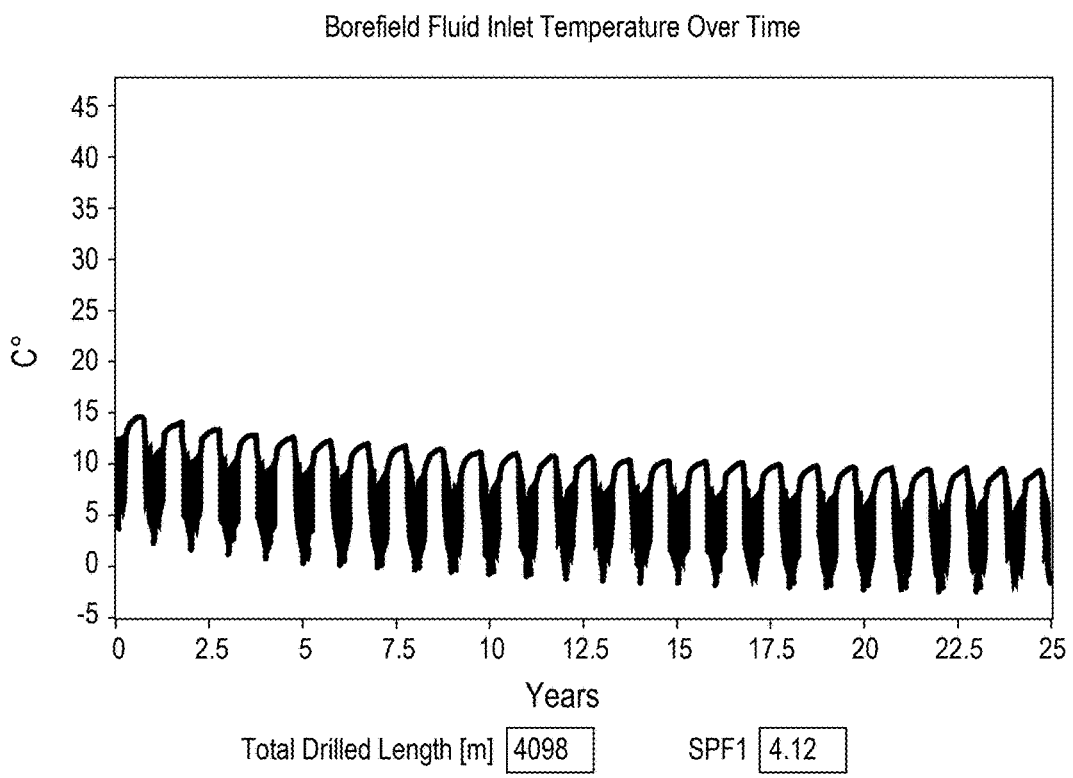
Figures 3, 7:
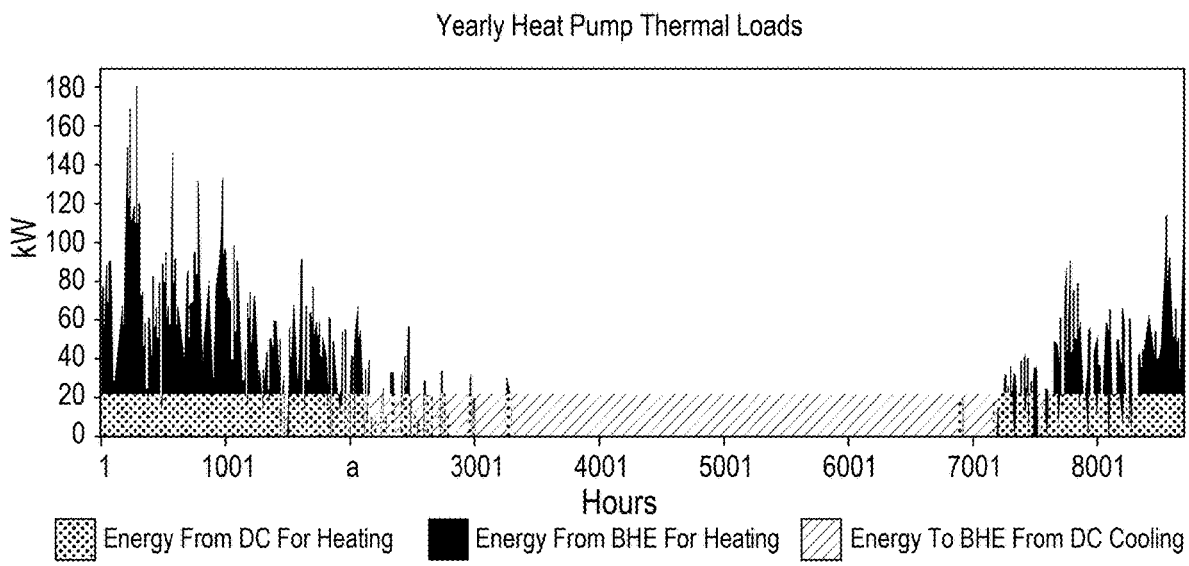
Figures 4, 7:
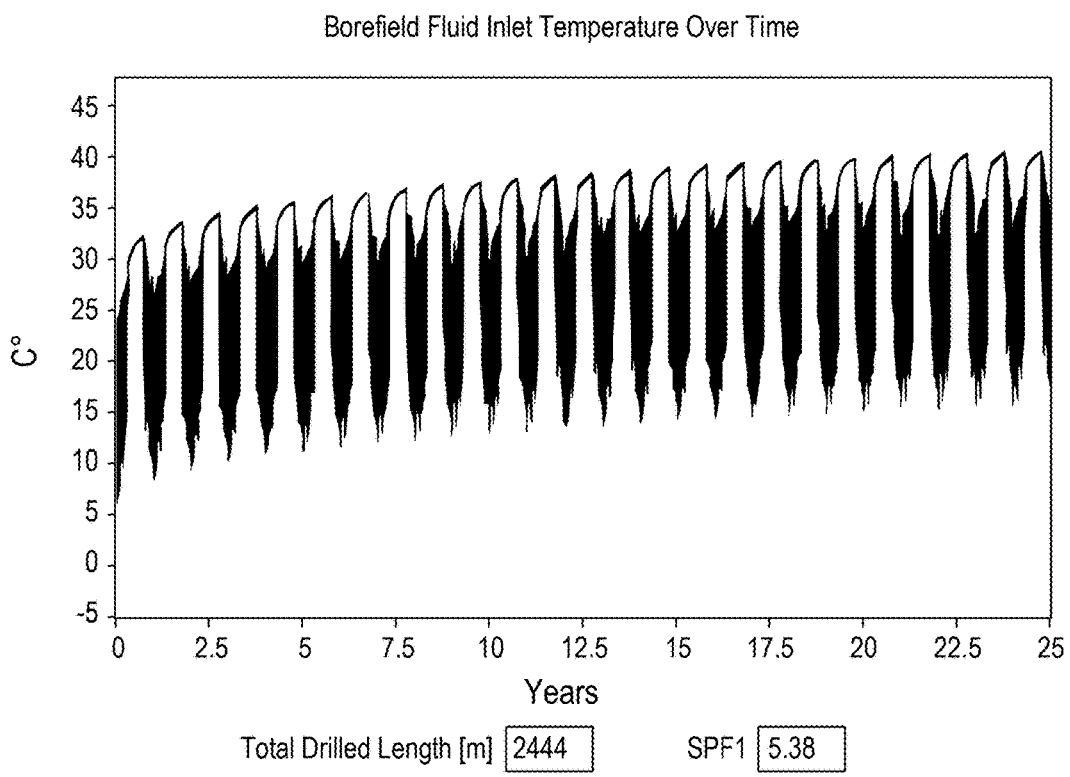

FIG. 7-1 illustrates an example thermal load over the course of a given year for an example facility in a colder climate, such as in Connecticut in the USA. As shown, the example facility has a heating load for about ⅔ or more of the year. Heating for the example facility can be provided by a ground-source heat pump with a corresponding borefield. FIG. 7-2 illustrates an example temperature provide over a 25-year regulatory period for the borefield inlet temperatures of such a thermal system. As shown, the fluid inlet temperature fluctuates throughout a given year, and on average decreases before hitting a low at 25 years. A governmental regulation limits the fluid temperature from surpassing below −3° C. before 25 years. Accordingly, to be in conformity with said legal requirement, the thermal system must be implemented with a borefield having at least a total drilled length of almost 4100 meters, and achieves a seasonal performance factor SPF of 4.12.

The thermal systems of the present disclosure, in contrast, are able to overcome these limitations by advantageously including a heat-generating data center that is sized, dimensioned, and configured with respect to the BHE and the facility. For example, FIG. 7-3 illustrates an example thermal load over the course of a given year for the same example facility in the same colder climate, but as implemented with a data center as described herein. As shown, for much of the year, heat from the data center is transferred to the facility to both cool the data center and to heat the facility, providing efficiency benefits and overcoming the limitations just described. To elaborate, for the same example facility, because more heat is injected into a corresponding borefield than in the conventional system of FIG. 7-2, the thermal systems of the present disclosure may limit the change in temperature of the subsurface formation. Accordingly, the present thermal systems may be advantageously implemented in cooler climates that are much more heating dominant, as ground temperatures may actually rise over time, contributing to a reserve of geothermal resources, or a thermal battery, for drawing on to provide efficient heating through much of the year.

As an example, FIG. 7-4 illustrates an example temperature profile over a 25-year regulator period for a borefield inlet temperature of the thermal system of FIG. 7-3. As shown, the temperature fluctuates over a given year, but actually rises over time, reaching a maximum at 25 years (e.g., a last year of a regulatory time period). A governmental regulation limits the fluid temperature from surpassing 40° C. before 25 years. Accordingly, the thermal system may be implemented with a borefield that is less than 2500 meters of total drilled length, a reduction in size by nearly 40%. Additionally, because of the rise in average temperature, the thermal system achieves a SPF of 5.88 which is about 140% greater. Accordingly, thermal systems according to the present techniques may be implemented to both improve efficiency, as well as facilitate more widespread implementation and reduced initial capital expense based on having significantly smaller borefield.

The benefits of the thermal system described herein are specifically achieved based on the size of the BHE (e.g., total drilled length) and of the data center (e.g., power capacity) together being dimensioned with respect to the thermal load(s) of the facility. As an example, as shown in FIG. 7-3, while the data center is, in many instances, advantageously utilized to heat the facility, in some instances, the data center heat exceeds the thermal load of the facility. In such instances the data center is cooled based on rejecting waste heat, wholly or in part, to the BHE. Thus, while a larger data center may, in some instances, be beneficial for meeting more of the thermal load of the facility, such a data center may come with a tradeoff of a larger borefield for adequately cooling the data center at times. Upfront and operation cost associated with a BHE may often represent a signification portion (e.g., up to 50% or more) of the total cost of implementing a geothermal system. Additionally, surface and/or underground space can often be limited such that implementing a sizeable borefield can present additional challenges. Thus, it may be advantageous to implement the techniques described herein with a data center and borefield of a specific size based on any of a number of factors or design considerations, such as initial capital expense, return on investment or time to payback, operational costs, space constraints, etc. For example, in many cases it may be desirable to dimension the borefield and data center so as to achieve a reduced (or minimum) sized borefield, even though this may not yield the largest possible data center. In another example, a specific budget or cost may be considered, and it may be desirable to implement a somewhat larger data center with a correspondingly larger borefield (e.g., not the minimum sized borefield) as long as the resulting thermal system can be implemented within a threshold cost (e.g., a threshold initial cost, operating cost, and/or payback time). Accordingly, a delicate balance and/or synergy exists between sizing the power capacity of the data center to advantageously contribute to the thermal heating loads of the facility while also reconciling the size of an associated borefield. Such a balance can be struck in many different ways based on the specific considerations or constraints that are important for a given application.

To elaborate, to achieve the benefits of the present techniques and/or to achieve specific cost, sizing, efficiency, or other considerations, the thermal systems described herein may be designed and dimensioned based on the data center, and the wellbore heat exchanger being design parameters that may be modified or adjusted to reach a desired or optimal balance. In this way, the inclusion of the data center in the present thermal systems is more than an opportunistic source or waste heat, but rather is an integral part of the design strategy of the thermal system.

In some embodiments, operational or design parameters that may be adjusted, modified, or tuned include the data center power capacity, the borefield size or total drilled length, and the heat pump capacity (e.g., to cover 100%, 80% or other threshold portion of the thermal load). These parameters may be adjusted to desired dimensions based on a peak and/or annual thermal load (e.g., heating and/or cooling of a facility) and based on other factors such as an initial capital cost, a return on investment of the thermal system, a capital cost (CAPEX), an operational cost (OPEX), energy coverage from the GSHP (e.g., for reaching a renewable energy target), C02 emissions, and other design considerations. Additionally, the design of a thermal system according to the present disclosure may also take into account constraints such as regulatory (e.g., country specific) borefield fluid temperatures, regulated quantities of coolant circulating in a BHE, space (e.g., property) restrictions, etc. Further, the present thermal systems may be designed to meet certain fixed parameters or requirements, such as a facility thermal load (including a threshold percentage of the thermal load) for heating, cooling, and domestic hot and/or cold water; ground properties such as thermal conductivity, capacity, initial temperatures, presence of aquifers, etc.; as well as a regulator duration or time period, such as 25 or 50 years.

In some embodiments, a thermal system may be modeled through analytical and/or machine learning methods to simulate the operations, effectiveness, efficiency, etc. of the thermal system. For instance, this analytical model may take into account any of the design parameters, considerations, constraints, or requirements just mentioned. An initial or starting point for the data center power capacity $P_{DC}$ in Watts (W) may be estimated based on the following formula:

$$P_{DC} = \frac{1}{8760}\left[Q_H\left(1 - \frac{1}{COP_H}\right) - Q_C\left(1 + \frac{1}{COP_C}\right)\right],$$

Where $Q_H$ and $Q_C$ respectively are the annual heating and cooling loads in Watt-hours (Wh) to be delivered to the facility, and $COP_H$ and $COP_C$ are the average coefficient of performance of the heat pump in heating and cooling modes. In some cases, this formula will tend to balance the load on the ground, making sure that the thermal battery is replenished. However, by implementing a data center as described herein, and by tailoring the together data center power capacity and/or BHE size, the facility thermal load may be met while achieving other specific and/or desirable design considerations, such as BHE drilled length, CAPEX, etc.

Figure 8:
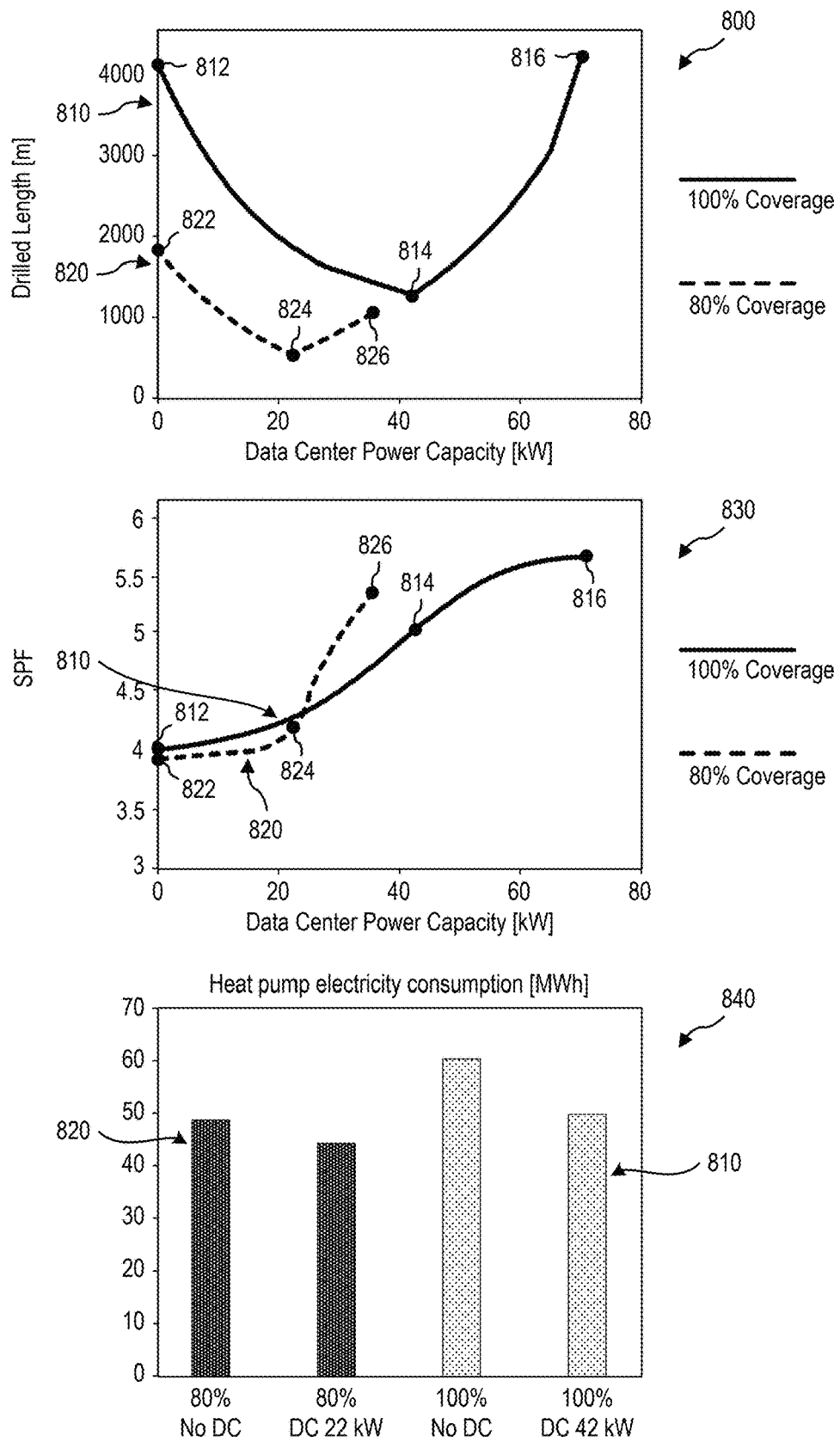
FIG. 8 illustrates example data for a thermal system having various dimensions of a borefield heat exchanger and a data center for a facility of a given thermal load.

As an illustrative example, FIG. 8 illustrates example data 800 for the drilled length of a BHE with respect to various power capacities of a data center. FIG. 8 also illustrates example data 830 for SPF with respect to data center power capacity, corresponding to the example data 800. FIG. 8 further illustrates example data 840 for electricity consumption by a GSHP based on corresponding data centers of a given power capacity, corresponding to the example data 800 and 830. In this example, the thermal system may be designed to provide heating (e.g., and cooling) to a facility having an annual thermal load of 250 MWh with a peak load of 197 kW.

FIG. 8 illustrates an example case 810 where 100% of the thermal load of the facility is provided by a downhole fluid circuit as described herein. In the example case 810, a point 812 represents the thermal system without a data center, or with a data center having a power capacity of 0 kW. As shown, the corresponding borefield has a drilled length of just over 4000 m. As the data center is added to the thermal system, and as the power capacity of the data center is increased (e.g., through simulation), the total drilled length of the borefield decreases. For instance, as described herein, the waste heat from the data center is provided to contribute to the thermal loads of the facility, and thus less heat is extracted from the borefield, contributing to its shorter length. However, at a point 814, a turning point occurs in which increasing the data center power capacity no longer results in a smaller borefield, but rather the borefield begins to increase. This is due to the fact that, while a larger data center can contribute more waste heat to heat the facility, a larger borefield is now needed to cool the data center at times when the facility cannot receive all (or any) of the data center's waste heat. Additionally, the facility may need cooling at times as described herein. Thus, after the point 814, the size of the borefield continues to grow to meet the increasing cooling demands of the data center. As represented by a point 816, a total drilled length of just over 4000 m is again needed, but now in connection with a data center having a power capacity of about 80 kW. Thus, while larger data centers may be implemented to cover more of the thermal loads of the facility, it may be more advantageous to tailor the size of the data center, as shown at point 814, to achieve a minimum drilled length of the borefield, which may lower implementation costs, reduce operational costs, and mitigate the challenges of implementing a borefield in a given (e.g. limited) space. Thus, by sizing and dimensioning the borefield and the data center together with respect to the thermal needs of the facility, the delicate interplay between the data center and BHE can be leveraged to find an optimal or desirable configuration for providing efficient heating of the facility and cooling of the data center, for example, while also minimizing the drilled length of the borefield. In other examples, it may be desirable to choose some other data center power capacity/drilled length combination to meet some other design considerations, such as choosing a larger data center (and larger borefield) having a greater cost, but being within an operational budget or threshold.

In addition to advantageously implementing a data center of a tailored power capacity having a smaller borefield, the SPF beneficially increases as well. For instance, the SPF increases from about 4.1 to about 5.2 and about 6 at points 812, 814, and 816, respectively. To elaborate, as described above, as implemented in cooler, heating-dominant climates, the present thermal systems may inject more heat into the ground that they extract, resulting in an increase in ground temperatures and an increase in downhole fluid temperature. The larger the relative size of the data center, the more this effect is realized. Consequently, the higher the fluid temperature from which a GSHP extracts heat, the more efficiently the GSHP may operate (e.g., with a higher SPF), and thus as the data center power capacity increases, so does the SPF as shown in example data 830. The GSHP operating at a higher efficiency is also characterized by less electricity consumed by the GSHP. As shown in example data 840, by including a data center with a power capacity of 42 kW (e.g., point 814), the GSHP only consumes about 48 MWh of electricity, a reduction from about 60 MWh for an implementation without a data center. Thus, by including an advantageously sized data center, the thermal system achieves an increase in thermal energy provided to the facility (e.g., eliminating supplemental heating device) but a decrease in electrical consumption.

Turning back to the example data 830, the point 814 is characterized by a SPF of about 5.2 representing a significant improvement over the SPF of about 4.1 at the point 812. While the SPF continues to increase beyond the point 814, the increase in data center power capacity comes with diminished returns. Thus, while an SPF of nearly 6 can be achieved at the point 816, such an increase may come with increased costs. Indeed, the point 814 is at or near a point where the increases in data center power capacity begins to experience diminishing returns in SPF. This, coupled with the corresponding increase in borefield length after the point 814, further illustrates that the specific design parameter dimensions (e.g., those corresponding with the point 814) may be identified for leveraging the subtle interplay between the design parameters to find an advantageous balance in many respects.

The example data 800, 830, and 840 of FIG. 8 also illustrates an example case 820, where 80% of the thermal load of the facility is provided by a downhole fluid circuit, with the remainder being met by supplemental thermal devices. The example case 820 exhibits similar characteristics to that of the example case 810, for instance, showing that from a point 822 (e.g., no data center implemented) the borefield size decreases to a point 824, in which the borefield size then begins to increase to a point 826. Additionally, corresponding increases in SPF can be seen in the example data 830. Further, the example data 840 shows that including the data center decreases the power consumption by the GSHP. While the example case 820 may be less efficient and/or effective than the example case 810, the example case 820 notably represents that further design considerations (e.g., CAPEX, available property/space) can be considered and/or weighted more heavily in order to further tailor the system dimensions. For example, significant efficiency benefits can still be gained by covering 80% (or some other threshold portion) of the thermal loads of a facility, albeit to a lesser degree. However, such an implementation may nevertheless be advantageous based on having an even further reduced borefield size.

Any other design characteristic or parameter may be favored, weighted, held constant, or otherwise considered in some other way in order to tailor the dimensioning of a thermal system to meet the unique needs of a given implementation. For example, in some cases a system may be limited by a specific borefield size, for example, based on limited space to drill wellbores. Accordingly, similar simulations may be performed for varying one or more parameters (e.g., data center power capacity, facility thermal load, GSHP capacity, threshold coverage of facility thermal load, etc.) while constraining the wellbore to a given drilled length. By advantageously sizing the power capacity of the data center such that the BHE can provide sufficient cooling to the data center (and in some cases the facility) as well as heating to the facility (together with the data center) a thermal system may be implemented that has an increased or optimal efficiency and/or effectiveness for a given (e.g., and potentially limited) borefield drilled length.

Figure 9:
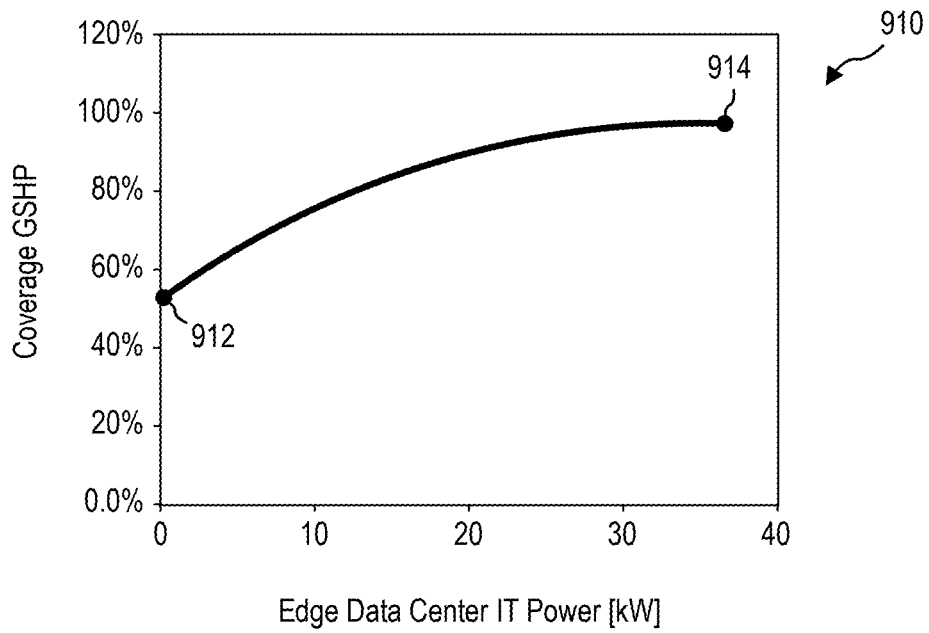
FIG. 9 illustrates example data for an example ground-source thermal system for fulfilling thermal loads of a facility.
Figure 9:
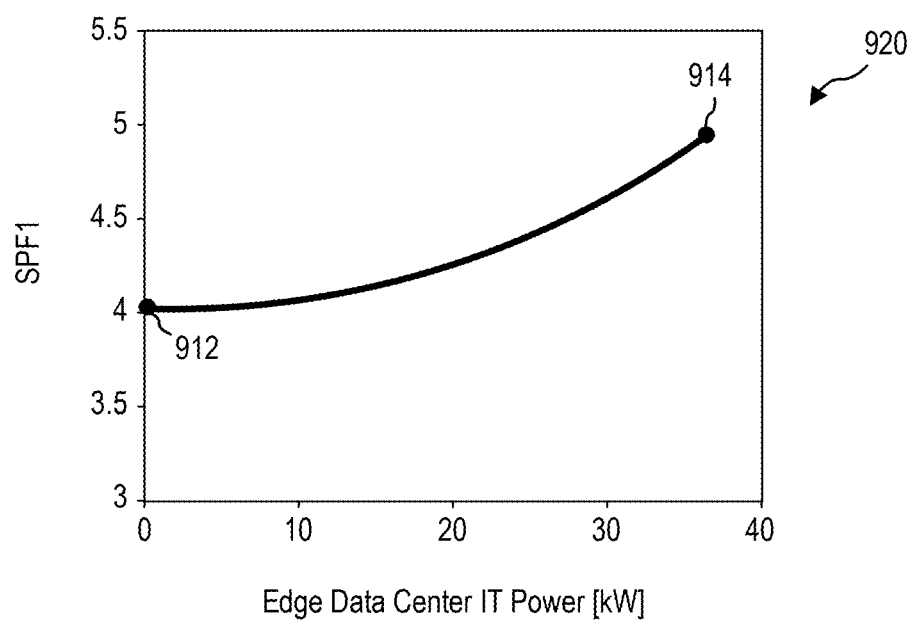

As an illustrative example, FIG. 9 illustrates example data for an example ground-source thermal system for fulfilling thermal loads of a facility. In this example, a BHE is constrained to having a borefield of only 1000 m, such as 5 wells that are each 200 m deep. Example data 910 shows a percentage of coverage by a GSHP for providing heating (e.g., and cooling) to a facility based on implementing a data center of various sizes, as described herein. Additionally, Example data 920 shows SPF for the thermal system based on implementing a data center of different power capacities, corresponding to the example data 910. At a point 912, no data center is implemented, the thermal system with the limited borefield size can only need about 55% of the thermal loads of the facility, and the SPF is about 4. Thus, supplemental thermal devices may be needed to provide the remainder of the thermal load to the facility. By including a data center, however, that is both used to heat the facility and is cooled by the BHE (at times), it can be seen that the coverage of the GSHP increases with an increase in data center power capacity, all with the same sized borefield. For instance, at a point 914, nearly all (e.g., 99%) of the thermal loads of the building can be met by the thermal system without having to increase the size of the borefield. Additionally, the benefits of having a (e.g., localized) data center are realized. Thus, by including and advantageously sizing a data center in a ground-source thermal system, the thermal system may be implemented for meeting all (or some other threshold) of the thermal needs of a facility where such would not have been possible given the sizing constraints of a borefield.

While the present techniques have been described primarily with respect to a thermal system that is more localized to a facility, such as a single or small collection of buildings, in some embodiments, a thermal system may be designed, and specifically dimensioned, for application with a large-scale or wide-spread application. For example, the thermal systems described herein may be applicable for providing efficient heating and/or cooling to large and/or numerous thermal consumers, including thermal consumers of diverse types. For instance, the present thermal systems may be implemented as part of a $5^{th}$ generation district heating and cooling (5GDHC) network which may include many different participants having different thermal usage profiles.

Figure 10:
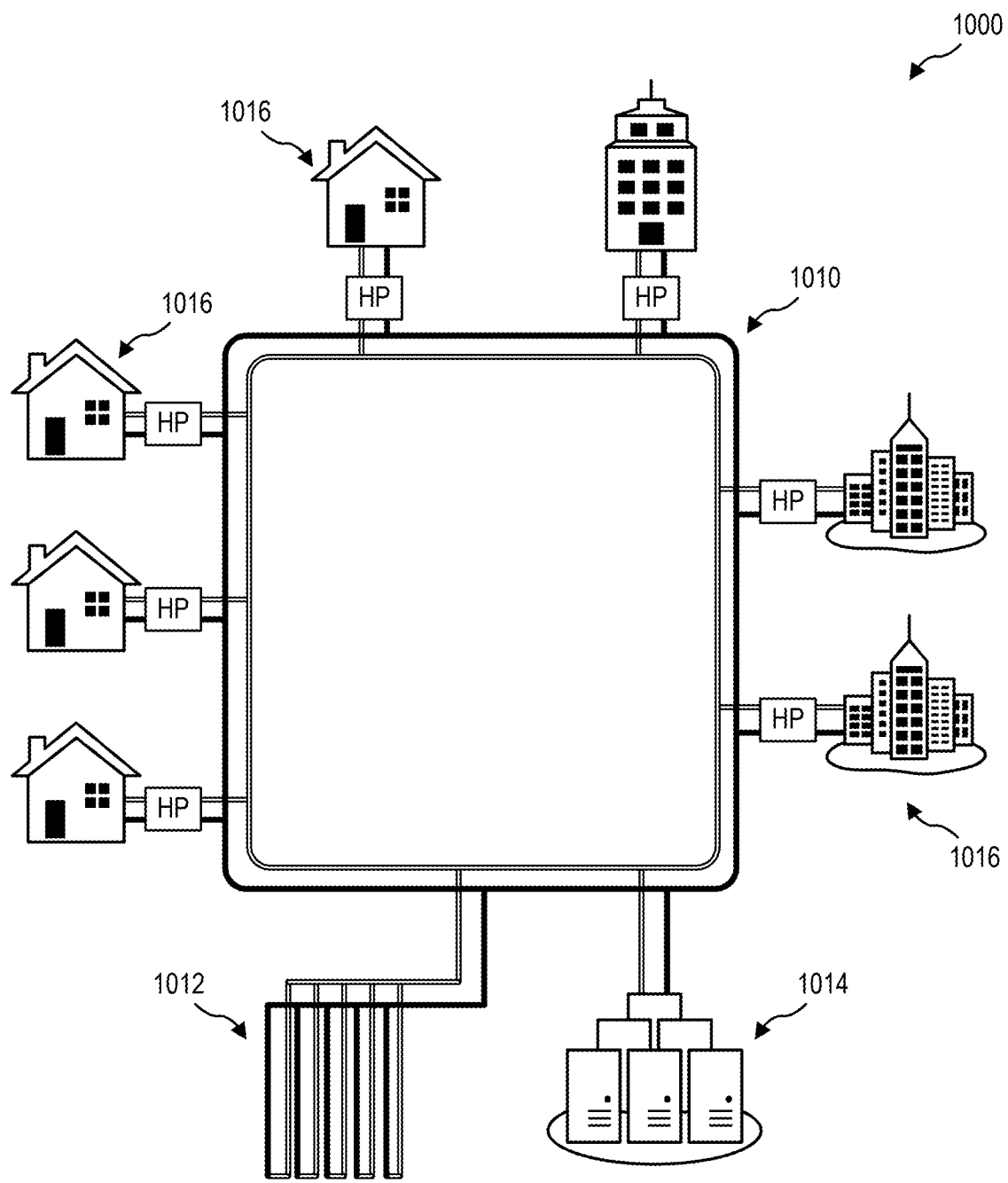
FIG. 10 illustrates an example implementation of a thermal system as described herein as applied to a $5^{th}$ generation district heating and cooling network.

FIG. 10 illustrates an example implementation of a thermal system 1000 as described herein as applied to a 5GDHC network. The thermal system 1000 includes a BHE 1012, a data center 1014, and a plurality of thermal consumers 1016. Each of these components may be connected in the thermal system 1000 via a downhole fluid circuit 1010. For example, the thermal consumers 1016 may each have an associated GSHP for exchanging heat with a downhole fluid of the downhole fluid circuit 1010.

The thermal system 1000 may be designed and sized, and more specifically the BHE 1012 and the data center 1014 may be dimensioned, according to the techniques described herein, for example, in order to achieve the thermal needs of the thermal consumers 1016 with a borefield having a tailored size. For example, the data center 1014 and BHE 1012 may be dimensioned and optimized with respect to a cumulative thermal load (e.g., peak and/or annual) of all of the thermal consumer 1016 in the thermal system 1000.

The cumulative thermal load may take into account both heat extracted from and rejected to the downhole fluid by the thermal consumers 1016. For example, some thermal consumers may need heating, some may need cooling, and/or some may need both heating and cooling. The heating needs of one thermal consumer may be offset (at least to some degree) by the cooling needs of another, and vice versa. Thus, by totaling the thermal requirements of all of the thermal consumers 1016 cumulatively, the system may be more adequately dimensioned to the actual needs of the system as a whole.

For instance, the data center 1014 may be implemented for rejecting waste heat to the downhole fluid and for providing heating to one or more thermal consumers 1016, but only to the extent as is needed by the system as a whole, as described herein. Similarly, the BHE 1012 may be included to maintain a thermal balance or temperature of the downhole fluid for providing supplemental heating and/or cooling to one or more components, for example, as needed during times of elevated or peak thermal demand. Thus, the data center 1014 and the BHE 1012 may together be dimensioned according to the design techniques discussed herein to provide a tailored or optimal system that may provide efficient heating and cooling while reducing cost and facilitating ease of implementation of an associated borefield of the BHE 1012.

The thermal system 1000 may be implemented as a 5GDHC network of a street, neighborhood, campus, town, or other collection of buildings and other thermal consumers. The data center 1014 may be implemented as an edge data center collocated with, adjacent, or near the collection of thermal consumers 1016, such as within a building of one of the thermal consumers 1016. In some cases, the data center 1014 may be implemented as several data centers each independently connected to the downhole fluid circuit 1010 at various locations. The BHE 1012 may be similarly collocated, and may also be implemented as one, or several borefields connected to and/or positioned at various locations in the downhole fluid circuit 1010. In this way, BHE 1012, and specifically the data center 1014, may be dimensioned, positioned, and otherwise configured not merely as opportunistic sources of thermal energy, but rather, as intentional and integral components of the thermal system. For instance, the data center 1014 may not necessarily be a massive, commercial-style data center having a power capacity that is significantly larger (e.g., orders of magnitude larger) than the cumulative thermal load, but may have a power capacity that is tailored specifically to (and is less than, as described herein) the cumulative thermal (e.g., heating) load of the thermal consumers 1016. In this way, the data center 1014 can operate at a full power capacity, reject all of its waste heat to the downhole fluid, and be cooled by a BHE having a minimal drilled length (or other tailored length) as needed at times. In this way, the thermal system 1000 may provide the same benefits as described herein in one or more smaller-scale embodiments, for example, but to a larger degree. For instance, the thermal system 1000 may provide further efficiency benefits based on the distinct thermal profiles (e.g., heating and/or cooling) of the various thermal consumers.

The thermal system 1000 may also facilitate expansion of the thermal system 1000, for example, to adjacent, future, or other thermal consumers. For example, the thermal system 1000 may be incorporated into a neighborhood or campus, and as new buildings (or other thermal consumers) are added, the thermal system 1000 may be extended to those thermal consumers. Along those lines, the BHE 1012 may be expanded, or other BHE added, in conjunction with the data center 1014 expanded (or new data center added) to accommodate the further expansion of the network to serve more thermal consumers. The addition and/or expansion of the BHE 1012 and the data center 1014 may be done in the tailored and designed manner as described herein in order that the thermal system 1000 may be expanded with further thermal consumers while achieving the benefits described herein.

Figure 11:
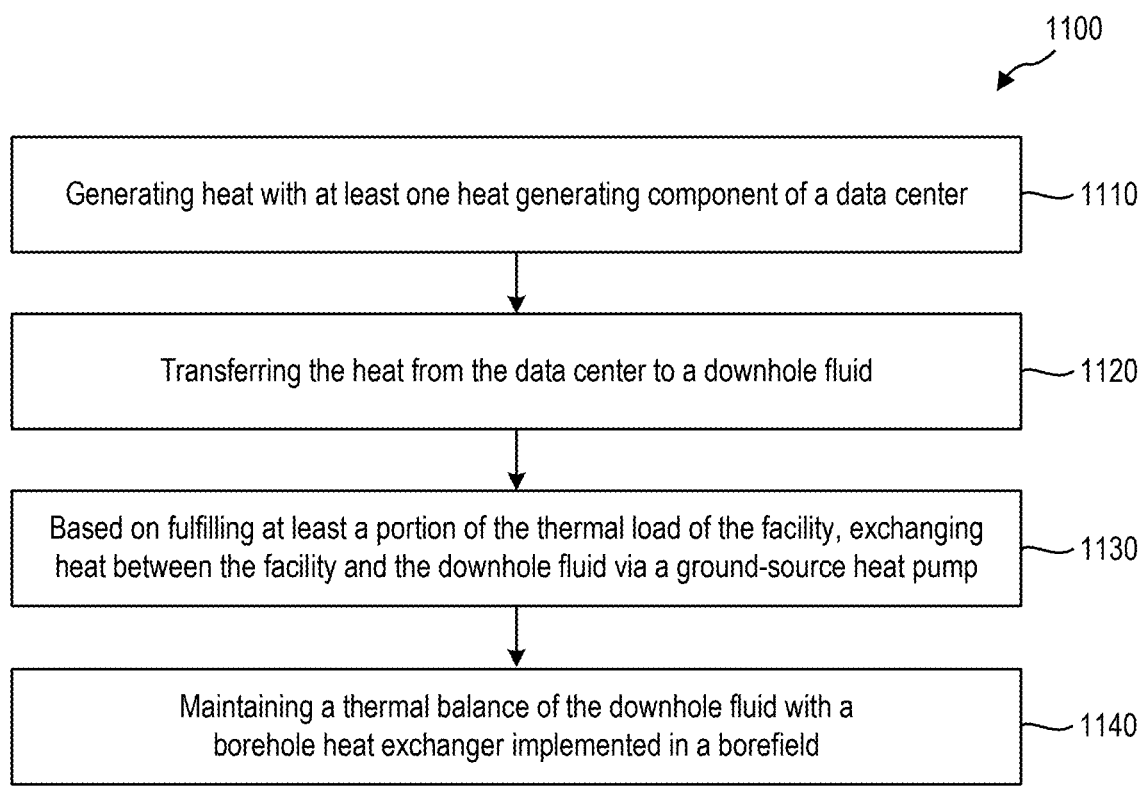
FIG. 11 illustrates a flow chart for a method or a series of acts for operating a thermal system as described herein, according to at least one embodiment of the present disclosure.

FIG. 11 illustrates a flow diagram for a method 1100 or a series of acts for operating a thermal system as described herein, according to at least one embodiment of the present disclosure. While FIG. 11 illustrates acts according to one embodiment, alternative embodiments may add to, omit, reorder, or modify any of the acts of FIG. 11.

In some embodiments, the method 1100 includes an act 1110 of generating heat with at least one heat generating electronic component of a data center. In some embodiments, the method 1100 includes an act 1120 of transferring the heat from the data center to a downhole fluid.

In some embodiments, the method 1100 includes an act 1130 of transferring a portion of the heat from the downhole fluid to one or more facilities via a ground-source heat pump. In some embodiments, the method 1100 includes an act 1140 of maintaining a thermal balance of the downhole fluid with a borehole heat exchanger (BHE).

In some embodiments, the thermal load of the facility is a heating load, and exchanging heat includes transferring the data center heat from the downhole fluid to the facility. For instance, the thermal load of the one or more facilities may be greater than the data center heat. Accordingly, maintaining the thermal balance of the downhole fluid includes transferring a ground heat from the borefield via the BHE to the downhole fluid to supplement the data center heat to meet the thermal load of the facility.

In some embodiments, the thermal load of the one or more facilities is a heating load, and exchanging heat includes transferring the data center heat from the downhole fluid to the facility. For instance, the thermal load of the one or more facilities may be less than the data center heat. Accordingly, maintaining the thermal balance of the downhole fluid includes transferring an excess portion of the data center heat from the downhole fluid to the borefield via the BHE.

In some embodiments, the thermal load of the one or more facilities is a cooling load, and exchanging heat includes transferring a facility heat from the one or more facilities to the downhole fluid via the GSHP. Accordingly, maintaining the thermal balance of the downhole fluid includes transferring the data center heat and the facility heat from the downhole fluid to the borefield via the BHE.

In some embodiments, the one or more facilities have no thermal load such that no heat is exchanged between the one or more facilities and the downhole fluid via the GSHP. Accordingly, maintaining the thermal balance of the downhole fluid includes transferring the data center heat from the downhole fluid to the borefield via the BHE.

Figure 12:
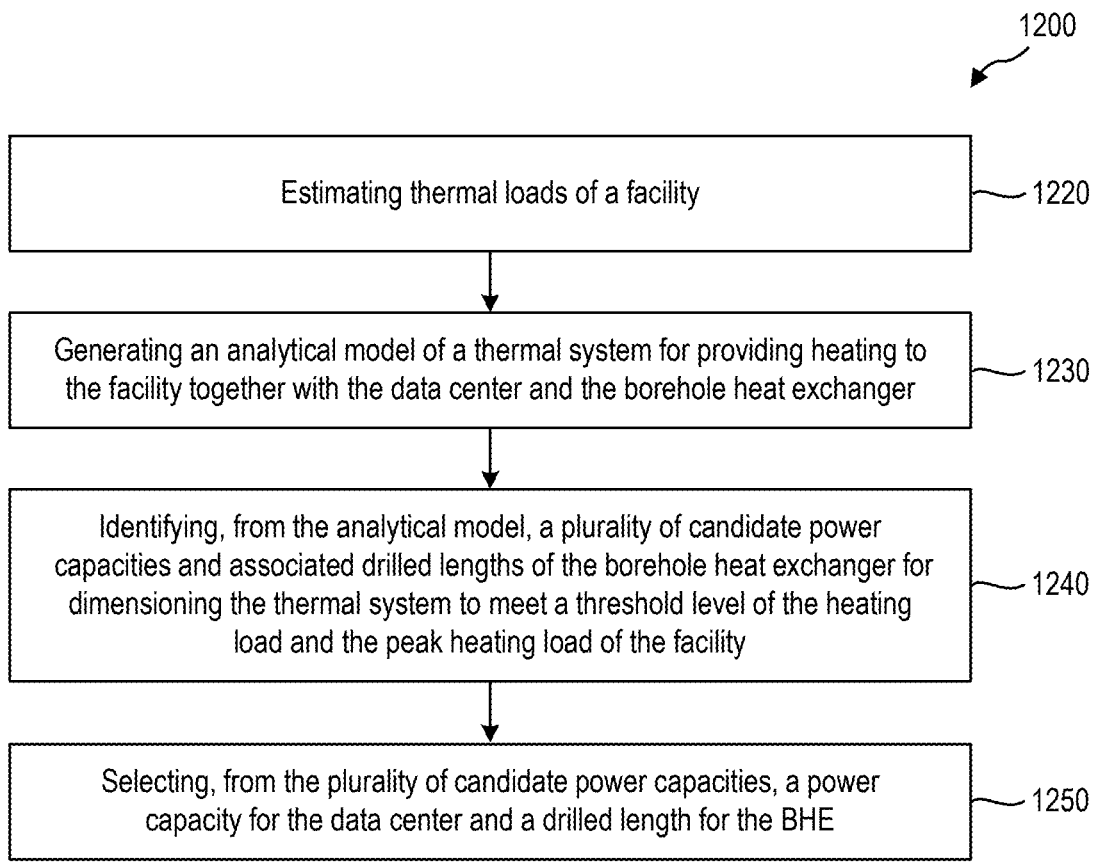
FIG. 12 illustrates a flow chart for a method or a series of acts for dimensioning a thermal system as described herein, according to at least one embodiment of the present disclosure.

FIG. 12 illustrates a flow diagram for a method 1200 or a series of acts for dimensioning a thermal system as described herein, according to at least one embodiment of the present disclosure. While FIG. 12 illustrates acts according to one embodiment, alternative embodiments may add to, omit, reorder, or modify any of the acts of FIG. 12.

In some embodiments, the thermal system includes a BHE, a data center, and one or more GSHPs for one or more facilities, each connected via a downhole fluid circuit for transferring heat via a downhole fluid.

In some embodiments, the method 1200 includes an act 1220 of estimating thermal loads of the one or more facility. For example an annual thermal load and/or a peak thermal load of the facility may be identified. The thermal load(s) may be heating and/or cooling loads. In some embodiments, hourly thermal loads of the one or more facilities may be identified for the course of a year. In some embodiments, the method 1200 includes an act 1230 of generating a model, such as an analytical model or a machine learning model, of a thermal system for providing heating to the facility together with the data center and the borehole heat exchanger.

In some embodiments, the method 1200 includes an act 1240 of identifying, from the model, a plurality of candidate power capacities and associated drilled lengths of the BHE for dimensioning the thermal system to meet a threshold level of the heating load and of the peak heating load of the facility. In some embodiments, the model accounts for the subsurface properties (including thermal conductivity, thermal capacity, initial temperature, presence of aquifers), heat pump properties (including COP, power capacity, etc.). In some embodiments, the candidate power capacities and associated drilled lengths are identified based on additional constraints relative to the project such as the maximum drilled length (due to property size), a minimum and maximum temperature of the borehole inlet fluid (regulatory constraints), a maximum temperature of the cooling fluid for the data center. In some embodiments, the candidate power capacities and associated drilled lengths are identified for a 100% coverage of the heating load/peak heating load, using the thermal system or a lower threshold coverage (for instance, 80%) using the thermal system and using supplemental heating systems.

In some embodiments, the method 1200 includes an act 1250 of, selecting, from the plurality of candidate power capacities, a power capacity for the data center and a drilled length for the BHE. In some embodiment, the method 1200 also selects a threshold for the coverage of the heating load/peak heating load by the thermal system (e.g., 100% or lower). In some embodiments, the candidates are selected to optimize one or more optimization criteria, such as the drilled length, a capital cost (CAPEX) of the thermal system, a payback time of the installation (considering CAPEX and OPEX cost versus CAPEX and OPEX costs of other reference thermal system), the coverage of the facility thermal needs by the thermal system, $CO_2$ emissions. For example, a power capacity may be selected that correspond with a minimum drilled length of the BHE. In another example, a power capacity for the data center and an associated drilled length for the BHE may be selected based on a threshold initial capital expense. In another example, a power capacity for the data center and an associated drilled length for the BHE may be selected based on a threshold payback time for the thermal system. In another example, the power capacity for the data center and an associated drilled length for the BHE may be selected so that the energy coverage of the GSHP is maximum while respecting a threshold initial capital expense.

In some embodiments, identifying the candidates may include running simulations based on the system model and/or performing a mathematical minimization of a cost function that might include different criteria with their weights.

In some embodiments, a power capacity for the data center and an associated drilled length for the BHE are selected that are dimensioned to cover 100% of the heating load and of the peak heating load of the facility to provide heating to the facility without supplemental heating devices. In some embodiments, a power capacity for the data center and an associated drilled length for the BHE are selected that are dimensioned to cover less than 100% of the heating load and of the peak heating load of the facility to achieve a shorter drilled length for the BHE. In some embodiments, the method includes implementing the thermal system with the data center having the selected power capacity and the BHE having the associated drilled length.

In some embodiments, the method 1200 includes identifying thermal loads of one or more facilities, identifying a maximum drilled length for the BHE, generating a model of the thermal system for providing heating to the one or more facilities together with the data center and the BHE, identifying, from the model, a plurality of candidate power capacities and associated drilled lengths of the BHE for dimensioning the thermal system to meet a threshold level of the heating load and of the peak heating load of the one or more facilitates, and selecting, from the plurality of candidate power capacities, a greatest power capacity for the data center having a corresponding drilled length for the BHE that is no greater than the maximum drilled length.

INDUSTRIAL APPLICABILITY

The following description includes various embodiments that, where feasible, may be combined in any permutation. For example, the embodiment of any of the following paragraphs may be combined with any or all other embodiments of the following paragraphs. Embodiments that describe acts of a method may be combined with embodiments that describe, for example, systems and/or devices. Any permutation of the following paragraphs is considered to be hereby disclosed for the purposes of providing "unambiguously derivable support" for any claim amendment based on the following paragraphs. Furthermore, the following paragraphs provide support such that any combination of the following paragraphs would not create an "intermediate generalization."

In some embodiments, a thermal system includes a borehole heat exchanger (BHE), a facility, a data center including at least one heat generating electronic component, a ground-source heat pump (GSHP), a dynamic downhole fluid circuit for connecting the data center, the BHE, and the GSHP with a flow of a downhole fluid, wherein the dynamic downhole fluid circuit is configured to connect the data center, the BHE, and the GSHP into a plurality of different configurations to reject heat from the data center, and a facility fluid circuit for connecting the facility and the GSHP with a facility fluid, wherein the GSHP thermally connects the dynamic downhole fluid circuit and the facility fluid circuit.

In some embodiments, in a first configuration of the dynamic downhole fluid circuit, the data center and the BHE are connected to the GSHP to transfer heat from the data center and from the BHE to the facility via the GSHP.

In some embodiments, in a second configuration of the dynamic downhole fluid circuit, the data center is connected to the GSHP and the BHE to transfer heat from the data center to the facility and to the BHE.

In some embodiments, in a third configuration of the dynamic downhole fluid circuit, the data center and the BHE are connected in a closed loop to transfer heat from the data center to the BHE, and the GSHP is not connected to the closed loop.

In some embodiments, in a third configuration of the dynamic downhole fluid circuit, the data center, the BHE, and the GSHP are connected and the GSHP is turned off to transfer heat from the data center to the BHE without transferring heat to the facility via the GSHP.

In some embodiments, the thermal system is configured to reject 100% of a waste of the data center through the dynamic downhole fluid circuit.

In some embodiments, the data center does not include any supplemental cooling devices for rejecting waste heat from the data center.

In some embodiments, in a fourth configuration of the dynamic downhole fluid circuit, the data center and the GSHP are connected to the BHE to transfer heat from the data center and from the facility to the BHE.

In some embodiments, the thermal system includes one or more sensors, one or more valves, and one or more pumps for configuring the dynamic downhole fluid circuit into the plurality of different configurations based on monitoring heat generated by the data center.

In some embodiments, the dynamic downhole fluid circuit is configured into the plurality of different configurations based on monitoring a thermal load of the facility.

In some embodiments, the data center is collocated with the facility.

In some embodiments, the facility includes a collection of multiple thermal consumers.

In some embodiments, a peak heating load of the facility is greater than a thermal capacity of the data center.

In some embodiments, the data center is configured with a liquid cooling system for rejecting heat from at least one heat generating electronic component.

In some embodiments, a dynamic downhole fluid circuit includes a data center, a borehole heat exchanger (BHE), a ground-source heat pump (GSHP) for transferring heat with a facility, wherein the dynamic downhole fluid circuit is configurable between a first mode for rejecting heat from the data center to the BHE, a second mode for rejecting heat from the data center to the BHE and to the GSHP, and a third mode for rejecting heat from the data center and from the BHE to the GSHP.

In some embodiments, the fluid circuit is configurable for a fourth mode for rejecting heat from the data center and from the GSHP to the BHE.

In some embodiments, the GSHP is connected to a facility fluid circuit for transferring heat between the dynamic downhole fluid circuit and the facility fluid circuit.

All embodiments of the system described hereinabove may be combined with one another as part of the current disclosure.

In some embodiments, a method of operating a thermal system includes generating a data center heat with at least one heat generating electronic component of a data center, transferring the data center heat from the data center to a downhole fluid, exchanging heat between a facility and the downhole fluid via a ground-source heat pump (GSHP) to fulfill at least a portion of a thermal load of the facility, and maintaining a thermal balance of the downhole fluid with a borehole heat exchanger (BHE) implemented in a borefield.

In some embodiments, the thermal load of the facility is a heating load, exchanging heat includes transferring the data center heat from the downhole fluid to the facility, wherein the thermal load of the facility is greater than the data center heat, and maintaining the thermal balance of the downhole fluid includes transferring a ground heat from the borefield via the BHE to the downhole fluid to supplement the data center heat to meet the thermal load of the facility.

In some embodiments, the thermal load of the facility is a heating load, exchanging heat includes transferring the data center heat from the downhole fluid to the facility, wherein the thermal load of the facility is less than the data center heat, and maintaining the thermal balance of the downhole fluid includes transferring an excess portion of the data center heat from the downhole fluid to the borefield via the BHE.

In some embodiments, the thermal load of the facility is a cooling load, exchanging heat includes transferring a facility heat from the facility to the downhole fluid via the GSHP, and maintaining the thermal balance of the downhole fluid includes transferring the data center heat and the facility heat from the downhole fluid to the borefield via the BHE.

In some embodiments, the facility has no thermal load such that no heat is exchanged between the facility and the downhole fluid via the GSHP, and maintaining the thermal balance of the downhole fluid includes transferring the data center heat from the downhole fluid to the borefield via the BHE.

In some embodiments, a thermal system includes a borehole heat exchanger (BHE), a facility having a peak heating load, a data center including at least one heat generating electronic component, a ground-source heat pump (GSHP), and a dynamic downhole fluid circuit for connecting the data center, the BHE, and the GSHP with a flow of a downhole fluid, the dynamic downhole fluid circuit being configured to reject heat from the data center to the facility and to the BHE, wherein a power capacity of the data center is less than the peak heating load of the facility.

In some embodiments, a heating threshold of the peak heating load of the facility is provided by the dynamic downhole fluid circuit.

In some embodiments, the heating threshold is less than 100%, and further comprising a supplemental heating device for providing a remainder of the peak heating load of the facility.

In some embodiments, the power capacity of the data center and a power capacity of the BHE are sized together to meet the heating threshold while optimizing one or more criteria.

In some embodiments, the criteria include a borefield total drilled length and the power capacity of the data center.

In some embodiments, the criteria include one or more of an initial capital cost, return on investment, operational cost, renewable energy target, or $CO_2$ emissions target for the thermal system.

In some embodiments, the power capacity of the BHE and/or of the data center are estimated using a model accounting for parameters of the thermal system, wherein the parameters include one or more of borefield fluid inlet temperature, borefield fluid outlet temperature, a borefield total drilled length or a regulated quantity of coolant within the BHE, a capacity of the GSHP, a heating load of the facility, or a cooling load of the facility.

In some embodiments, the power capacity of the data center is selected so as to maximize the heating threshold for a set borefield total drilled length.

In some embodiments, the data center is collocated with the facility.

In some embodiments, the thermal system includes a facility fluid circuit for connecting the facility and the GSHP with a facility fluid, wherein the GSHP thermally connects the dynamic downhole fluid circuit and the facility fluid circuit.

In some embodiments, the GSHP has a seasonal performance factor of greater than 5.

In some embodiments, a power capacity of the data center and a drilled length of a borefield of the BHE are together sized and configured based on a thermal load of the facility such that the data center is configured to operate continually at the power capacity.

In some embodiments, a fluid inlet temperature for the BHE is governed by a regulatory threshold within a regulatory time period, and wherein a power capacity of the data center and a power capacity of the BHE are together sized based on a thermal load of the facility such that the fluid inlet temperature does not reach the regulatory threshold before a last year of the regulatory time period.

In some embodiments, the facility includes a plurality of thermal consumers and the peak heating load is a cumulative peak heating load of all of the plurality of thermal consumers.

In some embodiments, the cumulative peak heating load accounts for at least one cooling load of at least one of the plurality of thermal consumers that at least somewhat offsets a heating load of another thermal consumer in the cumulative peak heating load.

In some embodiments, the data center comprises a plurality of data centers each independently connected to the downhole fluid circuit.

All embodiments of the method described hereinabove may be combined with one another as part of the current disclosure.

In some embodiments, a method of dimensioning a thermal system including a borehole heat exchanger (BHE), a data center, and a ground-source heat pump for a facility, each connected via a downhole fluid circuit for transferring heat via a downhole fluid, the method comprising identifying a thermal load of the facility, generating a model of the thermal system for providing heating to the facility together with the data center and the BHE, identifying, from the model, a plurality of candidate power capacities and associated drilled lengths of the BHE for dimensioning the thermal system to meet a threshold level of the thermal load of the facility, and selecting, from the plurality of candidate power capacities, a power capacity for the data center and a drilled length for the BHE.

In some embodiments, selecting is based on one or more of an initial capital cost of the thermal system, an operational cost of the thermal system, a return on investment of the thermal system, a renewable energy target for the thermal system, or C02 emissions of the thermal system.

In some embodiments, identifying includes identifying the plurality of candidates that cover 100% or less than 100% of the thermal load of the facility and selecting includes selecting a percentage of the thermal load of the facility to be covered by the data center and BHE.

In some embodiments, the method further includes implementing the thermal system with the data center having the selected power capacity and the BHE having the associated drilled length.

All embodiments of the method described hereinabove may be combined with one another as part of the current disclosure.

In some embodiment, the disclosure relates to a system for heating at least one thermal load element, including at least a heat pump, each heat pump having a working fluid circuit, for circulating the working fluid, wherein the working fluid circuit includes a first and a second heat exchanger. The system also includes a downhole fluid circuit for circulating a downhole fluid, including a borehole heat exchanger having one or more wellbores and a data center cooling circuit located in a data center having one or more computing devices. The downhole fluid circuit is configured so that the downhole fluid circulates in the borehole heat exchanger so as to exchange calories with a subsurface, and in the cooling circuit of a data center so as to exchange calories with the data center, and in at least a first heat exchanger so as to exchange calories with the working fluid. The system also includes at least a load fluid circuit for circulating a load fluid, wherein the load fluid circuit is configured so that the load fluid circulates in at least a second heat exchanger and at least one of the thermal load element to exchange calories with the working fluid.

In some embodiments, the downhole fluid circuit comprises one or more fluid distribution devices and is configured to take at least a first configuration in which the downhole fluid exiting the data center cooling circuit is directed to the second heat exchanger, optionally via the borehole heat exchanger, and a second configuration in which the downhole fluid exiting the data center cooling circuit is directed to the borehole heat exchanger and the downhole fluid exiting the borehole heat exchanger is directed to the data center cooling circuit.

In some embodiments, the downhole fluid circuit is further configured to take a third configuration in which a first portion of the downhole fluid exiting the data center cooling circuit is directed to the second heat exchanger and a second portion of the downhole fluid exiting the data center cooling circuit is directed to the borehole heat exchanger.

All embodiments of the system described hereinabove may be combined with one another as part of the current disclosure.

In some embodiments, the disclosure also relates to a method for operating a heating system for heating at least a thermal load element. The method includes, when the energy need of the thermal load element is non-null, circulating a downhole fluid in a borehole heat exchanger having one or more wellbores and in a cooling circuit of a data center having one or more computing devices, so as to exchange calories with the subsurface and the data center; circulating the downhole fluid in a first heat exchanger, wherein a working fluid of a heat pump also circulates in the first heat exchanger, so as to exchange calories with the working fluid and evaporates the working fluid; compressing the working fluid and circulating the working fluid in a second heat exchanger; circulating a load fluid in the second heat exchanger so that the load fluid receives calories from the working fluid, and circulating the load fluid in the thermal load element.

In some embodiments, the method includes controlling a circulation of the downhole fluid so that, when the energy need of the thermal load element exceeds a first threshold, the downhole fluid exiting the data center cooling circuit is directed to the second heat exchanger, optionally via the borehole heat exchanger.

In some embodiments, the method includes controlling the downhole fluid circuit so that, controlling a circulation of the downhole fluid so that, when the energy need of the thermal load element is not zero but is below the first threshold, a first portion of the downhole fluid exiting the data center cooling circuit is directed to the second heat exchanger and a second portion of the downhole fluid exiting the data center cooling circuit is directed to the borehole heat exchanger.

In some embodiments, the method includes sensing the temperature of the downhole fluid at least upstream and/or downstream of the data center and determining the first threshold as a function of the sensed temperatures.

In some embodiment, when the energy need of the thermal load is null, the method includes circulating the downhole fluid in a loop between the borehole heat exchanger and the cooling circuit of the data center, so as to receive calories from the data center and inject at least some of those calories in the subsurface.

All embodiments of the method described hereinabove may be combined with one another as part of the current disclosure.

In some embodiments, the disclosure relates to a method of dimensioning a heating system including a heat pump, a borehole heat exchanger having one or more wellbores and a data center having one or more computing devices, wherein the system is used to heat a thermal load element. The method includes modelling the system using a model accounting for a plurality of configuration parameters, inputting one or more optimization criteria to optimize, determining one or more design parameter of the system that optimizes the one or more optimization criteria using a optimization function, wherein the one or more design parameters include a data center computing power, and outputting the one or more design parameters to facilitate construction of the heating system including the heat pump, borehole heat exchanger having one or more wellbores and the data center.

In some embodiments, the plurality of configuration parameters include one or more of thermal load element energy need, heat pump properties, cost of electricity, cost of drilling.

In some embodiments, the method also includes inputting one or more constraints, wherein the one or more constraints include at least one of a minimum temperature of the wellbore, a maximum temperature of the wellbore, a maximum cooling temperature of the data center, a maximum drilled length.

In some embodiments, the one or more design parameters further include at least one of the heat pump capacity and the drilled length.

In some embodiments, the optimization criteria include one or more of a percentage of the energy need provided by the heat pump, a total cost of the construction of the system, a payback time of the system, a drilled length.

All embodiments of the method described hereinabove may be combined with one another as part of the current disclosure.

The embodiments of the thermal systems described herein have been primarily described with reference to wellbore and/or borefield applications. The thermal systems described herein may be used in applications other than in association with one or more wellbores. In other embodiments, the thermal systems according to the present disclosure may be used outside of a wellbore and/or downhole environment. For instance, the thermal systems of the present disclosure may be used in connection with air-source heat pumps, water-source heat pumps, or any other thermal system, heat transfer engine, or thermal cycle. Accordingly, the terms "wellbore," "borehole" and the like should not be interpreted to limit tools, systems, assemblies, or methods of the present disclosure to any particular industry, field, or environment.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that is within standard manufacturing or process tolerances, or which still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements. Additionally, as used herein, the term "and/or" includes any and all combinations of one or more of the associated listed items.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal system, comprising:
    a borehole heat exchanger (BHE);
    a facility;
    a data center including at least one heat generating electronic component;
    a ground-source heat pump (GSHP);
    a dynamic downhole fluid circuit comprising:
        a plurality of flow paths fluidly connecting the data center, the BHE, and the GSHP,
        at least one pump driving a downhole fluid through the plurality of flow paths between the data center, the BHE, and the GSHP, and
        a plurality of valves directing the downhole fluid through the plurality of flow paths between the data center, the BHE, and the GSHP, the plurality of valves having a plurality of different configurations to direct the downhole fluid to reject heat from the data center to the GSHP and/or the BHE, wherein a flow direction of the downhole fluid through the plurality of flow paths changes between the plurality of different configurations of the plurality of valves; and
    a facility fluid circuit fluidly connecting the facility and the GSHP with a facility fluid, wherein the GSHP thermally connects the dynamic downhole fluid circuit and the facility fluid circuit.

2. The thermal system of claim 1, wherein, in a first configuration of the plurality of valves, the downhole fluid is directed via the plurality of valves to flow from the data center toward the GSHP to transfer heat from the data center to the facility via the GSHP and the downhole fluid is directed via the plurality of valves to flow from the BHE toward the GHSP to transfer heat from the BHE to the facility via the GSHP.

3. The thermal system of claim 1, wherein, in a second configuration of the plurality of valves, the downhole fluid is directed via the plurality of valves to flow from the data center toward the GSHP to transfer heat from the data center to the facility and the downhole fluid is directed via the plurality of valves to flow from the data center toward the BHE to transfer heat from the data center to the BHE.

4. The thermal system of claim 1, wherein, in a third configuration of the plurality of valves, the downhole fluid is directed via the plurality of valves to flow between the data center and the BHE in a closed loop to transfer heat from the data center to the BHE, and the plurality of valves in the third configuration isolate the GSHP from the closed loop.

5. The thermal system of claim 1, wherein in a third configuration of the plurality of valves, the downhole fluid is directed via the plurality of valves to flow between the data center, the BHE, and the GSHP, and the GSHP is turned off to transfer heat from the data center to the BHE without transferring heat to the facility via the GSHP.

6. The thermal system of claim 1, wherein, in a fourth configuration of the plurality of valves, the downhole fluid is directed via the plurality of valves to flow from the data center toward the BHE to transfer heat from the data center to the BHE and the downhole fluid is directed via the plurality of valves to flow from the GSHP toward the BHE to transfer heat from the facility to the BHE.

7. The thermal system of claim 1, further comprising one or more sensors, wherein the plurality of valves is controllable between the plurality of different configurations based on monitoring heat generated by the data center.

8. The thermal system of claim 1, wherein the plurality of valves is controllable between the plurality of different configurations based on monitoring a thermal load of the facility.

9. The thermal system of claim 1, wherein the data center is collocated with the facility.

10. The thermal system of claim 1, wherein the facility includes a collection of multiple thermal consumers.

11. The thermal system of claim 1, wherein a peak heating load of the facility is greater than a thermal capacity of the data center.

12. The thermal system of claim 1, wherein the data center is configured with a liquid cooling system for rejecting heat from the at least one heat generating electronic component.

13. A dynamic downhole fluid circuit, comprising:
    a data center;
    a borehole heat exchanger (BHE);
    a ground-source heat pump (GSHP) for transferring heat with a facility;
    a plurality of flow paths fluidly connecting the data center, the BHE, and the GSHP;
    at least one pump driving a downhole fluid through the plurality of flow paths between the data center, the BHE, and the GSHP; and
    a plurality of valves directing the downhole fluid through the plurality of flow paths between the data center, the BHE, and the GSHP, wherein the plurality of valves is configurable between:
        a first mode in which the plurality of valves directs the downhole fluid from the data center toward the BHE for rejecting heat from the data center to the BHE;
        a second mode in which the plurality of valves directs the downhole fluid from the data center toward the BHE for rejecting heat from the data center to the BHE and in which the plurality of valves directs the downhole fluid from the data center toward the GSHP for rejecting heat from the data center to the GSHP; and
        a third mode in which the plurality of valves directs the downhole fluid from the data center toward the GSHP for rejecting heat from the data center to the GSHP and in which the plurality of valves directs the downhole fluid from the BHE toward the GSHP for rejecting heat from the BHE to the GSHP.

14. The fluid circuit of claim 13, wherein the plurality of valves is configurable for a fourth mode in which the plurality of valves directs the downhole fluid from the data center toward the BHE for rejecting heat from the data center to the BHE and in which the plurality of valves directs the downhole fluid from the GSHP to the BHE for rejecting heat from the GSHP to the BHE.

15. The fluid circuit of claim 13, wherein the GSHP is connected to a facility fluid circuit for transferring heat between the dynamic downhole fluid circuit and the facility fluid circuit.

16. A method of operating the thermal system of claim 1, comprising:
generating the data center heat with the at least one heat generating electronic component of the data center;
transferring the data center heat from the data center to the downhole fluid;
exchanging heat between the facility and the downhole fluid via the GSHP to fulfill at least a portion of a thermal load of the facility; and
maintaining a thermal balance of the downhole fluid with the BHE implemented in a borefield.

17. The method of claim 16, wherein:
the thermal load of the facility is a heating load,
exchanging heat includes transferring the data center heat from the downhole fluid to the facility, wherein the thermal load of the facility is greater than the data center heat, and
maintaining the thermal balance of the downhole fluid includes transferring a ground heat from the borefield via the BHE to the downhole fluid to supplement the data center heat to meet the thermal load of the facility.

18. The method of claim 16, wherein:
the thermal load of the facility is a heating load,
exchanging heat includes transferring the data center heat from the downhole fluid to the facility, wherein the thermal load of the facility is less than the data center heat, and
maintaining the thermal balance of the downhole fluid includes transferring an excess portion of the data center heat from the downhole fluid to the borefield via the BHE.

19. The method of claim 16, wherein:
the thermal load of the facility is a cooling load,
exchanging heat includes transferring a facility heat from the facility to the downhole fluid via the GSHP, and
maintaining the thermal balance of the downhole fluid includes transferring the data center heat and the facility heat from the downhole fluid to the borefield via the BHE.

20. The method of claim 16, wherein:
the facility has no thermal load and no heat is exchanged between the facility and the downhole fluid via the GSHP, and
maintaining the thermal balance of the downhole fluid includes transferring the data center heat from the downhole fluid to the borefield via the BHE.

* * * * *